US007735049B2

(12) United States Patent
Wang et al.

(10) Patent No.: US 7,735,049 B2
(45) Date of Patent: Jun. 8, 2010

(54) MASK NETWORK DESIGN FOR SCAN-BASED INTEGRATED CIRCUITS

(75) Inventors: Laung-Terng (L.-T.) Wang, Sunnyvale, CA (US); Xiaoqing Wen, Sunnyvale, CA (US); Boryau (Jack) Sheu, San Jose, CA (US)

(73) Assignee: Syntest Technologies, Inc., Sunnyvale, CA (US)

( * ) Notice: Subject to any disclaimer, the term of this patent is extended or adjusted under 35 U.S.C. 154(b) by 1155 days.

(21) Appl. No.: 11/350,949

(22) Filed: Feb. 10, 2006

(65) Prior Publication Data

US 2006/0156122 A1 Jul. 13, 2006

Related U.S. Application Data

(62) Division of application No. 10/876,784, filed on Jun. 28, 2004, now Pat. No. 7,032,148.

(60) Provisional application No. 60/484,639, filed on Jul. 7, 2003.

(51) Int. Cl.
*G06F 17/50* (2006.01)
*G01R 31/3177* (2006.01)
*G01R 31/3181* (2006.01)
*G01R 31/3185* (2006.01)

(52) U.S. Cl. .................. 716/18; 714/726; 714/727; 714/729

(58) Field of Classification Search .............. 716/1, 716/18; 714/726, 727, 729
See application file for complete search history.

(56) References Cited

U.S. PATENT DOCUMENTS 6,557,129 B1  4/2003  Rajski et al. ............... 714/729
6,829,740 B2 12/2004  Rajski et al. ............... 714/729
6,901,546 B2  5/2005  Chu et al. ................... 714/726
7,058,869 B2* 6/2006  Abdel-Hafez et al. ....... 714/729
2003/0229833 A1 12/2003  Nadeau-Dostie ............ 714/726

FOREIGN PATENT DOCUMENTS

WO  WO 2005031378 A1  4/2005

OTHER PUBLICATIONS

Wallis, A. D. And Woodman, Jr., G. R.; Joint Test Action Group Error Injection Configuration; IBM Technical Disclosure Bulletin; Jul. 1995; vol. 38, No. 07; pp. 5-8.
Mitra et al: "X-Compact: An Efficient Response Compaction Technique for Test Cost Reduction," Proc., IEEE Intl. Test Conf., 2002.
Mitra et al: "XMAX: X-Tolerant Architecture for MAXimal Test Compression," Proc. Intl. Conf. On Computer Design, pp. 326-330, 2003.

* cited by examiner

*Primary Examiner*—Sun J Lin
(74) *Attorney, Agent, or Firm*—Bacon & Thomas, PLLC

(57) ABSTRACT

A method and apparatus for selectively masking off unknown ('x') captured scan data in first selected scan cells 220 from propagating through the scan chains 221 for test, debug, diagnosis, and yield improvement of a scan-based integrated circuit 207 in a selected scan-test mode 232 or selected self-test mode. The scan-based integrated circuit 207 contains a plurality of scan chains 221, a plurality of pattern generators 208, a plurality of pattern compactors 213, with each scan chain 221 comprising multiple scan cells 220, 222 coupled in series. The method and apparatus further includes an output-mask controller 211 and an output-mask network 212 embedded on the scan data input path of second selected scan cells 222, or a set/reset controller controlling selected set/reset inputs of second selected scan cells. A synthesis method is also proposed for synthesizing the output-mask controller 211 and the set/reset controller.

38 Claims, 22 Drawing Sheets

MASK NETWORK DESIGN FOR SCAN-BASED INTEGRATED CIRCUITS

RELATED APPLICATION DATA

The present application is a divisional application of application Ser. No. 10/876,784 filed Jun. 28, 2004, now U.S. Pat. No. 7,032,148, for which priority is claimed and which claims the benefit of provisional application No. 60/484,639 filed Jul. 7, 2003.

FIELD OF THE INVENTION

The present invention generally relates to the field of scan-based design and test using design-for-test (DFT) techniques. Specifically, the present invention relates to the field of Scan/ATPG (automatic test pattern generation), Logic BIST (built-in self-test), and Compressed Scan/ATPG.

BACKGROUND OF THE INVENTION

Modern integrated circuits incorporate a variety of design-for-test (DFT) structures to enhance their inherent testability. The most popular DFT structure is based on scan design where a plurality of externally accessible scan chains are embedded into the integrated circuit. Each scan chain includes one or more scan cells coupled in series, with each scan cell comprising a scan flip-flop or a scan latch. Typically, scan design is used in conjunction with fault simulation and combinational ATPG (automatic test pattern generation) to generate manufacturing and diagnostic test patterns for production test, prototype debug, and yield improvement.

The increasing scale of integration has made it impractical to continue to implement scan designs where all scan chains are externally accessible, since the limited number of I/O pins results in a dramatic increase in the length of the scan chains which dramatically increases test cost. For these reasons, new DFT methodologies such as Logic BIST (built-in self-test) and Compressed Scan/ATPG have become increasingly popular. In these methodologies, scan chains are no longer externally accessible during the test process. Instead, a large number of scan chains are implemented in a design such that their scan chain inputs are controlled by pattern generators and their scan chain outputs are observed by pattern compactors. Pattern generators used include pseudorandom pattern generators (PRPG), random pattern generators (RPG), broadcasters, and decompressors. Pattern compactors used include multi-input signature-registers (MISRs) and linear compactors.

Utilizing these pattern generators and pattern compactors comes with the cost of limiting the amount of debug, diagnosis and yield-improvement possible using standard scan design techniques. In addition, unknown ('x') values generated by black-box circuits, or circuits where the capture results cannot be predicted by the automatic test pattern generation software, come with the additional cost of eliminating faults detected in other scan cells that are compacted alongside the scan cells capturing the unknown ('x') values. This lost fault coverage can dramatically lower the final fault coverage achieved.

Prior-art solutions to this problem fall under two categories. The first category of prior-art solutions focus on designing a mask network preceding the pattern compactor designed to prevent unknown ('x') values in the output scan data stream from reaching the pattern compactor. The second category of prior-art solutions focus on designing unknown ('x') tolerant compactors in order to limit the effect of unknown captured data on the fault coverage. There are inherent problems in each category of solutions. These prior-art solutions are summarized below:

Prior-art solution #1, FIG. 1A, is described in U.S. Pat. No. 6,557,129 by Rajski et al. (2003). This prior-art solution adds a selector circuit similar to what can be called an output-mask network, between the scan chain outputs and the inputs of the pattern compactor. A control circuit, similar to what can be called an output-mask controller is used to control which scan chains and scan cells should be prevented from being compacted in the pattern compactor. The main problem with this prior-art solution is that it is too general. Placing the output-mask network at the end of the scan chains and implementing a general output-mask controller requires a large amount of circuitry to mask off the required unknown values. Furthermore, placing the output-mask network between the outputs of the scan chains and the inputs of the pattern compactor reduces the speed at which the scan chains can be operated.

Prior-art solution #2, FIG. 1B, is described in papers by Mitra et al. (2002, 2003). In this solution, a design is proposed for an unknown ('x') tolerant pattern compactor capable of tolerating unknown ('x') values in the output scan data stream. The problem with this solution is that there is a limitation on the number of unknown ('x') bits that the unknown tolerant pattern compactor can tolerate, which depends on the compactor design. A further disadvantage as opposed to the first prior-art solution is that this solution cannot be used for debug and diagnosis of the scan chains after manufacturing.

Therefore, there is a need to improve upon the current unknown mask and tolerance capabilities of current solutions for DFT methodologies utilizing embedded scan chains. The solution according to this invention uses a small amount of circuitry for masking off unknown values in the output scan data stream from reaching the pattern compactors. In addition, this solution further allows one to perform scan debug, diagnosis and yield-improvement of the DFT methodologies utilizing embedded scan chains possibly without impacting the speed at which the scan operation is performed.

SUMMARY OF THE INVENTION

Accordingly, the main objective of the present invention is to provide a new method and apparatus for masking off and tolerating unknown ('x') values in the scan output data stream. In order to achieve this objective, we propose an output-mask controller and an output-mask network that can be placed before the scan data input of any scan cells. These are used to mask off unknown ('x') values from any scan cell, proceeding scan cells where the output-mask network is placed. Alternatively, we propose a set/reset controller that is capable of masking off unknown ('x') values from the scan data stream by activating the set/reset inputs of selected scan cells and replacing the unknown scan data with either a logic value 0 or logic value 1. This allows us to mask off unknown ('x') values without having to place any logic on the scan data path, allowing us to perform the unknown ('x') mask without impacting the speed at which the scan shift operation can be performed. The set/reset controller can be connected to existing scan cells with set/reset inputs, to existing scan cells by adding set/reset inputs, or to new scan cells that include set/reset inputs.

In order to reduce the required size of the output-mask controller or the set/reset controller, we propose to analyze the scan-based integrated circuit in order to identify the best location for such a controller. By analyzing the integrated circuit, scan cells can be grouped into two different categories. The first category of scan cells includes all scan cells that can receive an unknown ('x') value during scan-test or self-test, and the second category includes all scan cells that cannot. By utilizing this information, scan chains can be designed that are known to be free of unknown ('x') values, and neither output-mask controller and output-mask network nor set/reset controller associated with these scan chains are required. Furthermore, scan cells that can receive an unknown ('x') value during scan-test or self-test can be sorted such that they appear at the beginning of the scan chains. This allows us to place the output-mask controller and output-mask network, or the set/reset controller close to the beginning of the remaining scan chains, which reduces the size of these controllers.

In order to allow the unknown ('x') mask circuitry to be used for debug, diagnosis and yield-improvement, we further propose designing the output-mask controller and set/reset controller using any combination and design of cell-mask, chain-mask and pattern-mask controllers. These controllers allow us to specify combinations of which scan cells, which scan chains and which scan patterns to mask off, which gives us the required flexibility of masking off individual scan cells without having to mask off complete scan chains or scan patterns. This allows us to improve the yield for integrated circuits that contain scan design errors with minimum fault coverage loss.

Finally, the current invention can be used in conjunction to an x-tolerant (unknown-tolerant) compactor, which increases the amount of x-tolerance that can be achieved. For example, for an x-tolerant compactor that is capable of tolerating only two unknowns, using the current invention allows us to mask off any excess unknowns such that only two unknowns ('x') can reach the x-tolerant compactor at any given instance. This removes any limits over the amount of x-tolerance that can be achieved.

To summarize, the present invention allows us to use either an output-mask controller and output-mask network placed before the scan data inputs of selected scan cells, or a set/reset controller controlling the set/reset inputs of selected scan cells to mask off unknown ('x') values from the output scan data stream. This allows us to reduce the sizes of the controllers by confining all possible unknown ('x') values into a subset of the scan chains and further confining the possible unknown ('x') values to the beginning of the remaining scan chains. The design of the output-mask controller and set/reset controller is such that they can be further used for debug, diagnosis and yield-improvement in addition to x-tolerance. Finally, the controllers we propose can further be used in conjunction to an x-tolerant compactor, to improve the x-tolerance of the final system.

THE BRIEF DESCRIPTION OF DRAWINGS

The above and other objects, advantages and features of the invention will become more apparent when considered with the following specification and accompanying drawings wherein.

Figure 16:
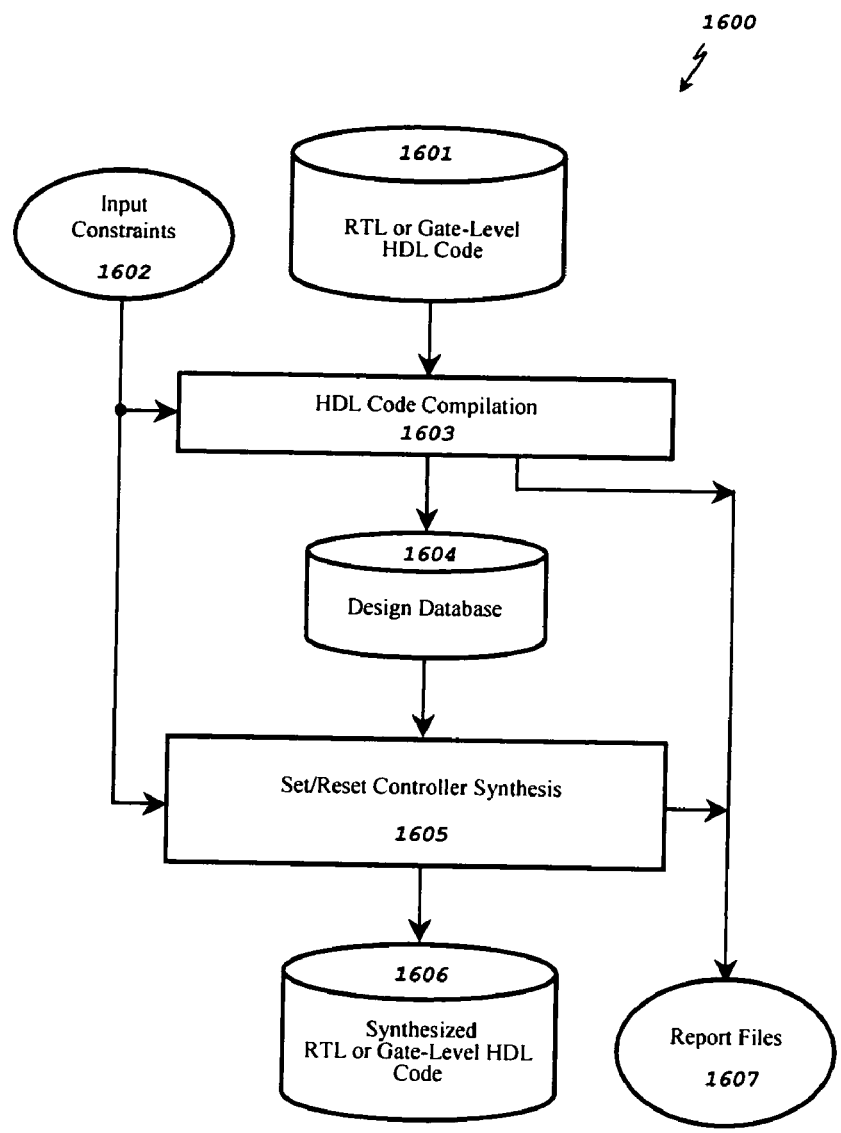
Figure 17:
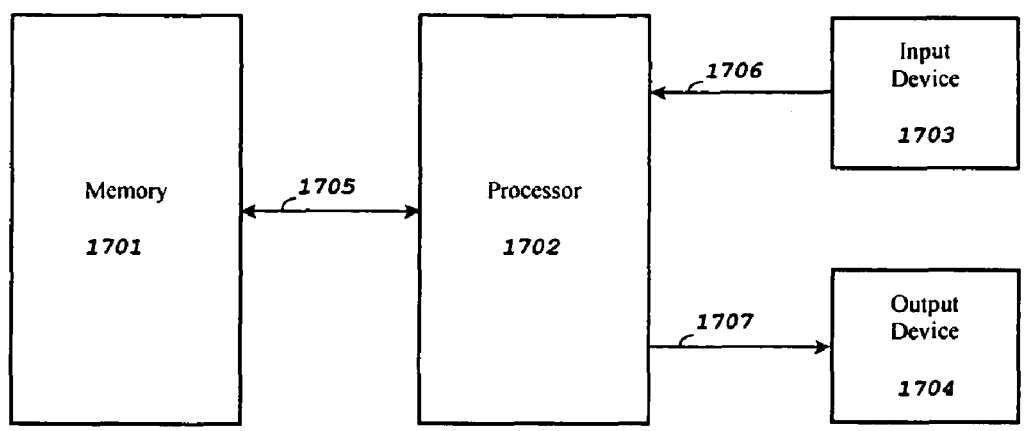

FIG. 16 shows a block diagram of a computer-aided design (CAD) system for synthesizing a set/reset controller for masking off unknown ('x') in test responses in scan chains within a scan-based integrated circuit, in accordance with the present invention; and FIG. 17 shows an electronic design automation system, where a computer-readable program, in accordance with the present invention, performs a method for synthesizing an output-mask controller or a set/reset controller, for selectively masking off unknown ('x') values in captured test responses in either scan-test or self-test mode.

DETAILED DESCRIPTION OF THE DRAWINGS

The following description is presently contemplated as the best mode of carrying out the present invention. This description is not to be taken in a limiting sense but is made merely for the purpose of describing the principles of the invention. The scope of the invention should be determined by referring to the appended claims.

Figure 1A:
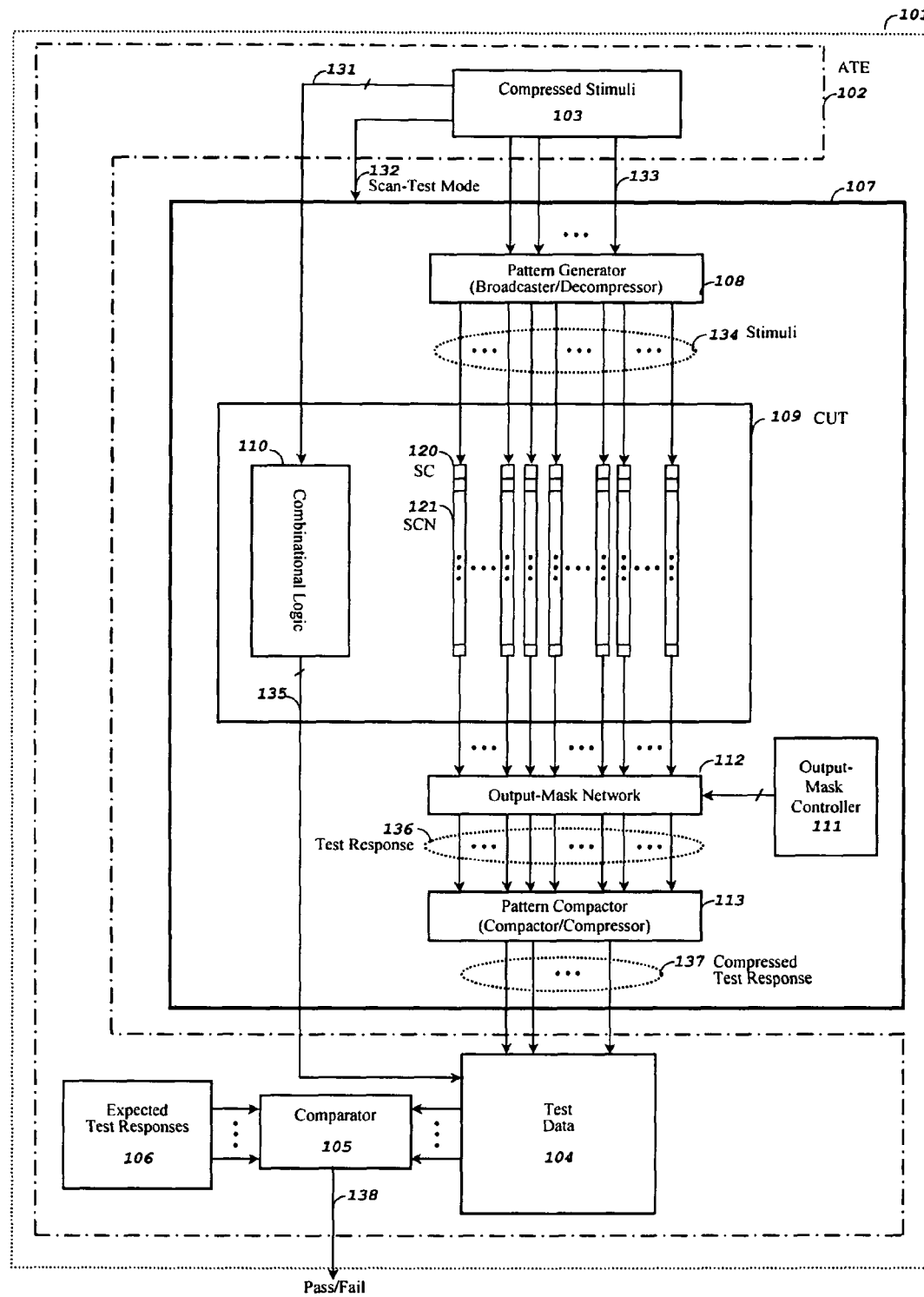
FIG. 1A shows a block diagram of a first prior-art compressed scan test environment in scan-test mode, where one output-mask network is embedded at the outputs of all scan chains to mask off unknown ('x') values in the test responses captured in all scan chains from coming into a pattern compactor.

FIG. 1A shows a block diagram 101 of a first prior-art compressed scan test environment in scan-test mode.

The circuit-under-test (CUT) 109 consists of a combinational logic block 110 and a plurality of scan chains SCN 121. Test stimuli 134 are provided to the scan chains from a pattern generator 108, which is either a broadcaster or a decompressor. The pattern generator is used to decompress compressed stimuli 103 provided from the ATE (automatic test equipment) 102. Note that some compressed stimuli may be provided directly to the combinational logic block through 131.

The outputs of all scan chains SCN 121 in the CUT 109 are connected to an output-mask network 112, which is controlled by an output-mask controller 111. The output-mask network is controlled in such a way that unknown ('x') values in the test responses captured in all scan chains are masked off from coming into a pattern compactor 113, which is either a compactor or a compressor. The results from the pattern compactor become compressed test responses 137, which are then compared with expected test responses 106 to find the pass/fail status of the CUT 109.

This solution suffers from two problems: First, placing an output-mask network at the outputs of all scan chains and implementing a general output-mask controller require a large amount of extra circuitry to mask off required unknown ('x') values. Second, placing an output-mask network between scan chains and a pattern compactor reduces the speed at which the scan chains can be operated.

Figure 1B:
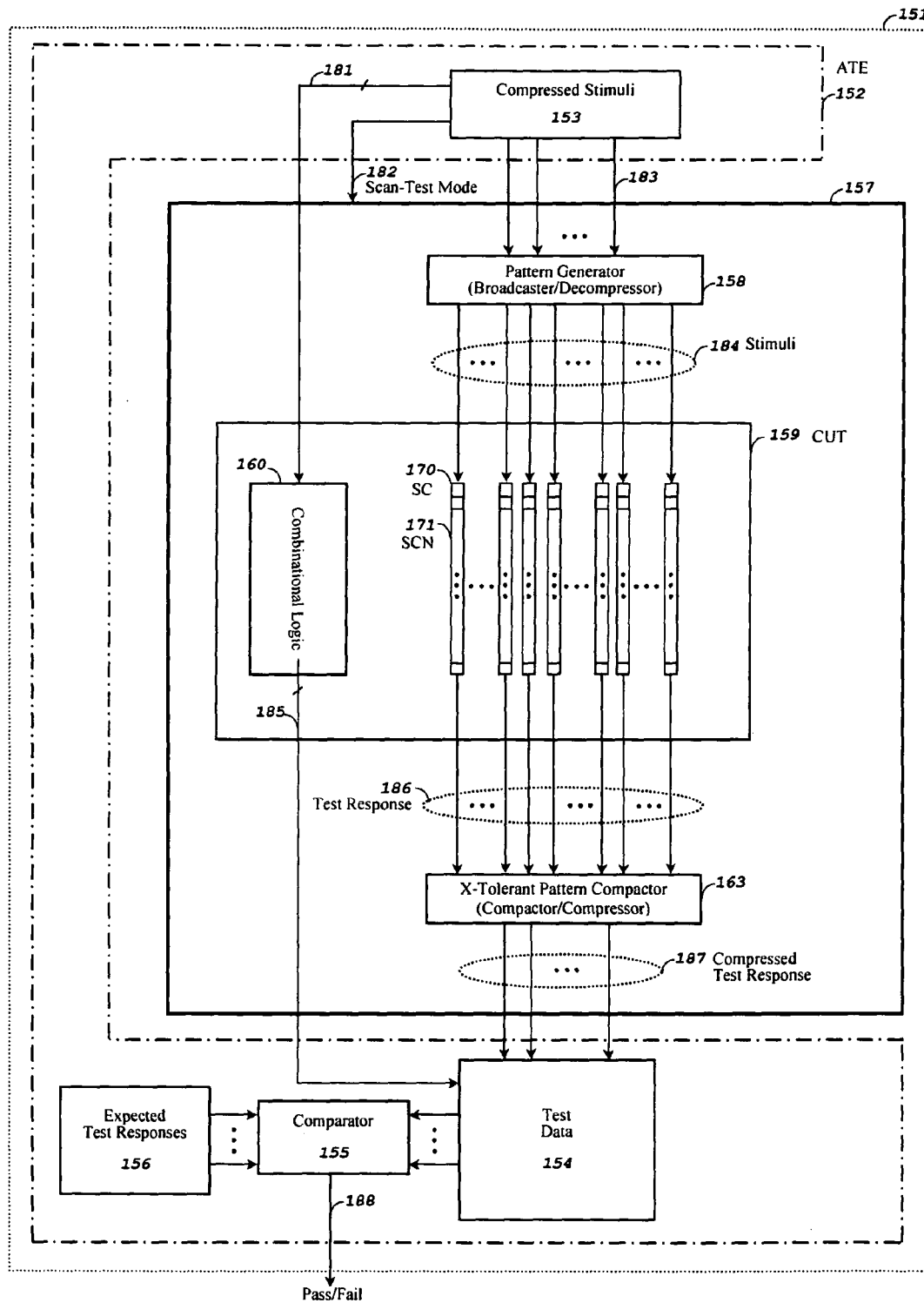
FIG. 1B shows a block diagram of a second prior-art compressed scan test environment in scan-test mode, where one X-tolerant pattern compactor, capable of tolerating unknown ('x') values in the test responses captured in all scan chains, is used.

FIG. 1B shows a block diagram 151 of a second prior-art compressed scan test environment in scan-test mode.

The circuit-under-test (CUT) 159 consists of a combinational logic block 160 and a plurality of scan chains SCN 171. Test stimuli 184 are provided to the scan chains from a pattern generator 158, which is either a broadcaster or a decompressor. The pattern generator is used to decompress compressed stimuli 153 provided from the ATE (automatic test equipment) 152. Note that some compressed stimuli 153 may be provided directly to the combinational logic block through 181.

The outputs of all scan chains SCN 171 in the CUT 159 are connected to an X-tolerant pattern compactor 163. The basic idea is that, if the number of unknown ('x') bits coming from the scan chains 171 is limited and if the pattern compactor is properly designed, then no fault coverage loss may be suffered even if there are unknown ('x') values coming into the pattern compactor 163. The results from the X-tolerant pattern compactor 163 become compressed test responses 187, which is then compared with expected test responses 156 to find the pass/fail status of the CUT 159.

Figure 2A:
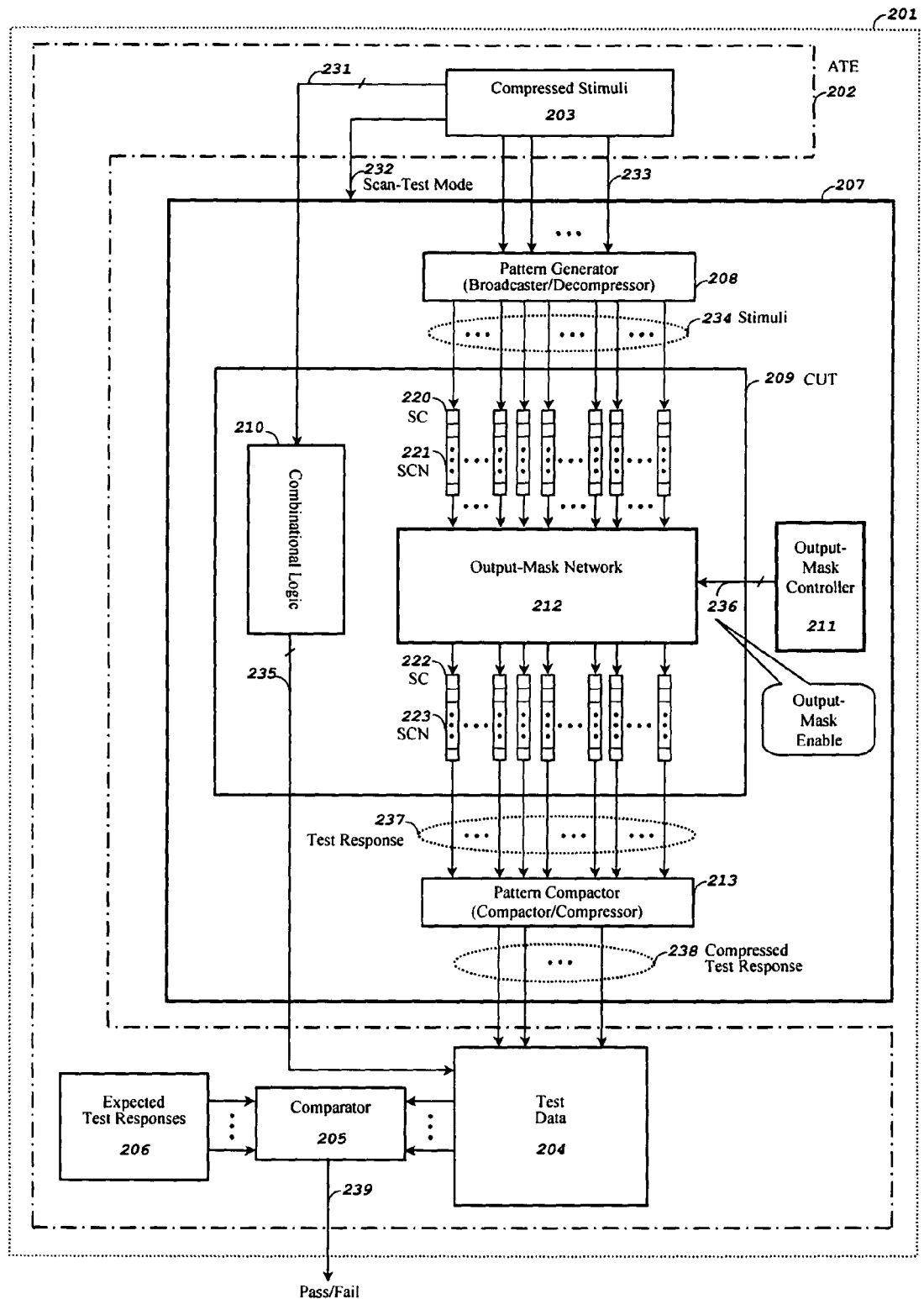
FIG. 2A shows a block diagram of a compressed scan test environment in scan-test mode, where one output-mask network is embedded between two groups of scan cells to mask off unknown ('x') values in the test responses captured in the first group of scan cells from coming into a pattern compactor, in accordance with the present invention.

This solution suffers from two problems: First, fault coverage loss may occur if the number of unknown ('x') bits is too large. Second, it cannot be used for debug and diagnosis of scan chains after a chip is manufactured. FIG. 2A shows a block diagram 201 of a compressed scan test environment in scan-test mode, in accordance with the present invention.

The circuit-under-test (CUT) 209 consists of a combinational logic block 210 and a plurality of scan chains SCN 221 and SCN 223. Test stimuli 234 are provided to the scan chains from a pattern generator 208, which is either a broadcaster or a decompressor. The pattern generator is used to decompress compressed stimuli 203 provided from the ATE (automatic test equipment) 202. Note that some compressed stimuli 203 may be provided directly to the combinational logic block through 231.

All scan cells are divided into two groups. The first group of scan cells SC 220 form scan chains SCN 221 which are close to the pattern generator 208. The second group of scan cells SC 222 form scan chains SCN 223 which are close to the pattern compactor 213. An output-mask network 212 is embedded between the two groups of scan cells and is controlled by an output-mask controller 211 through output-mask enable signals Output_Mask Enable 236. Note that the scan cell grouping is conducted in such a way that only scan cells in the first group of scan cells may capture unknown ('x') values in test responses. The output-mask network is controlled in such a way that unknown ('x') values in the test responses captured in the first group of scan cells are masked off from coming into the pattern compactor 213. The results from the pattern compactor become compressed test responses 238, which are then compared with expected test responses 206 to find the pass/fail status of the CUT 209. Note that the pattern compactor can be a sequential compressor, an x-tolerant sequential compressor, a linear compactor, or an x-tolerant linear compactor. Here, a sequential compressor includes a multi-input signature register (MISR), an x-tolerant sequential compressor includes an x-tolerant MISR, and a linear compactor or an x-tolerant linear compactor includes one or more Exclusive-OR (XOR) gates or Exclusive-NOR (XNOR) gates.

Figure 2B:
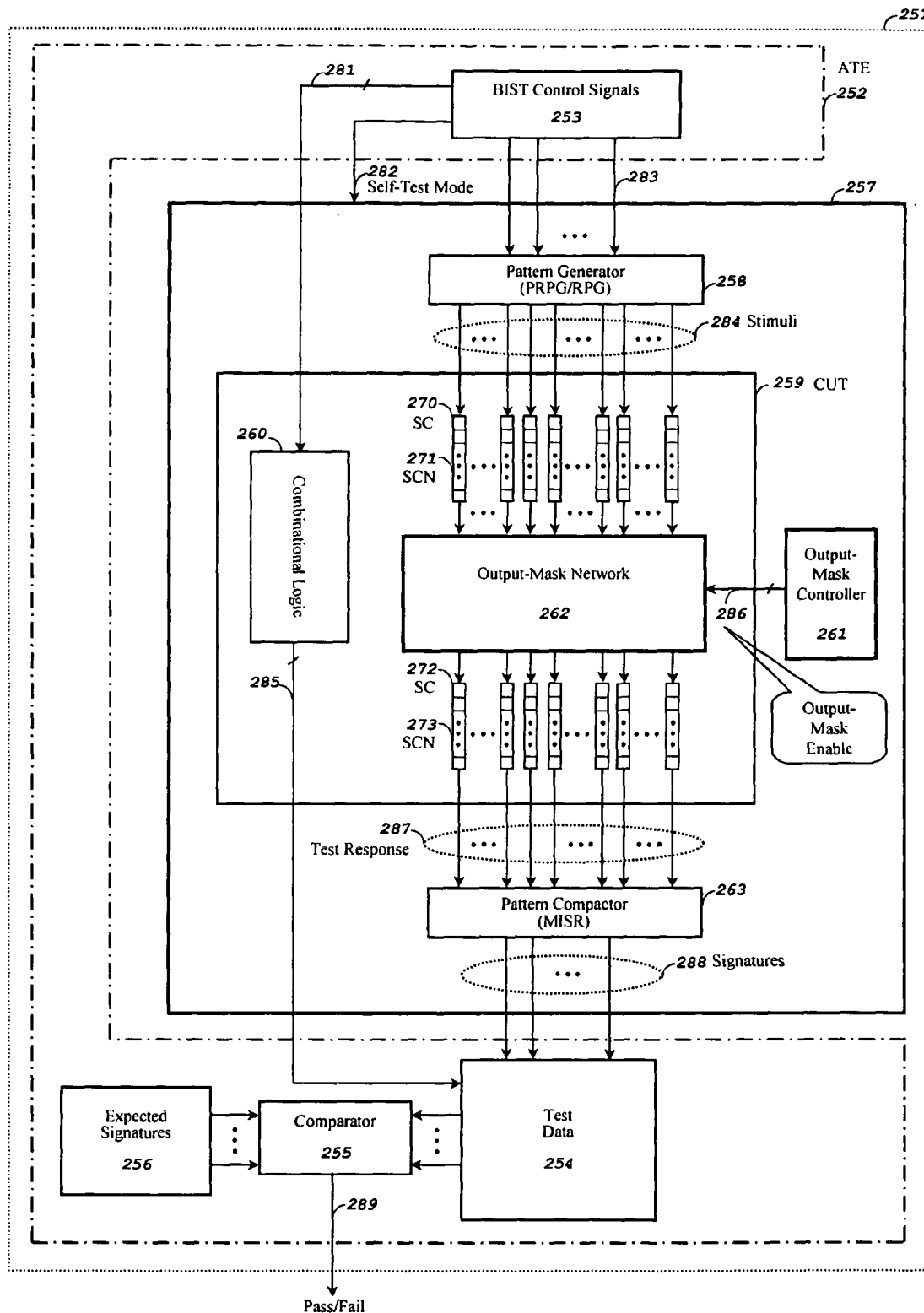
FIG. 2B shows a block diagram of a compressed scan test environment in self-test mode, where one output-mask network is embedded between two groups of scan cells to mask off unknown ('x') values in the test responses captured in the first group of scan cells from coming into a pattern compactor, in accordance with the present invention.

FIG. 2B shows a block diagram 251 of a compressed scan test environment in self-test mode, in accordance with the present invention.

The circuit-under-test (CUT) 259 consists of a combinational logic block 260 and a plurality of scan chains SCN 271 and SCN 273. Test stimuli 284 are provided to the scan chains from a pattern generator 258, which is either a pseudorandom pattern generator (PRPG) or a random pattern generator (RPG). The pattern generator is used to automatically generate test stimuli 284, controlled by some BIST (built-in self-test) control signals 283 from the ATE (automatic test equipment) 252. Note that some BIST control signals 253 may be provided directly to the combinational logic block through 281.

All scan cells are divided into two groups. The first group of scan cells SC 270 form scan chains SCN 271 which are close to the pattern generator 258. The second group of scan cells SC 272 form scan chains SCN 273 which are close to the pattern compactor 263. An output-mask network 262 is embedded between the two groups of scan cells and is controlled by an output-mask controller 261 through output-mask enable signals Output-Mask Enable 286. Note that the scan cell grouping is conducted in such a way that only scan cells in the first group of scan cells may capture unknown ('x') values in test responses. The output-mask network is controlled in such a way that unknown ('x') values in the test responses captured in the first group of scan cells are masked off from coming into the pattern compactor 263. The final status of the pattern compactor becomes a signature 288, which is then compared with the expected signature 256 to find the pass/fail status of the CUT 259. Note that the pattern compactor can be a sequential compressor, an x-tolerant sequential compressor, a linear compactor, or an x-tolerant linear compactor. Here, a sequential compressor includes a multi-input signature register (MISR), an x-tolerant sequential compressor includes an x-tolerant MISR, and a linear compactor or an x-tolerant linear compactor includes one or more Exclusive-OR (XOR) gates or Exclusive-NOR (XNOR) gates.

Figure 3A:
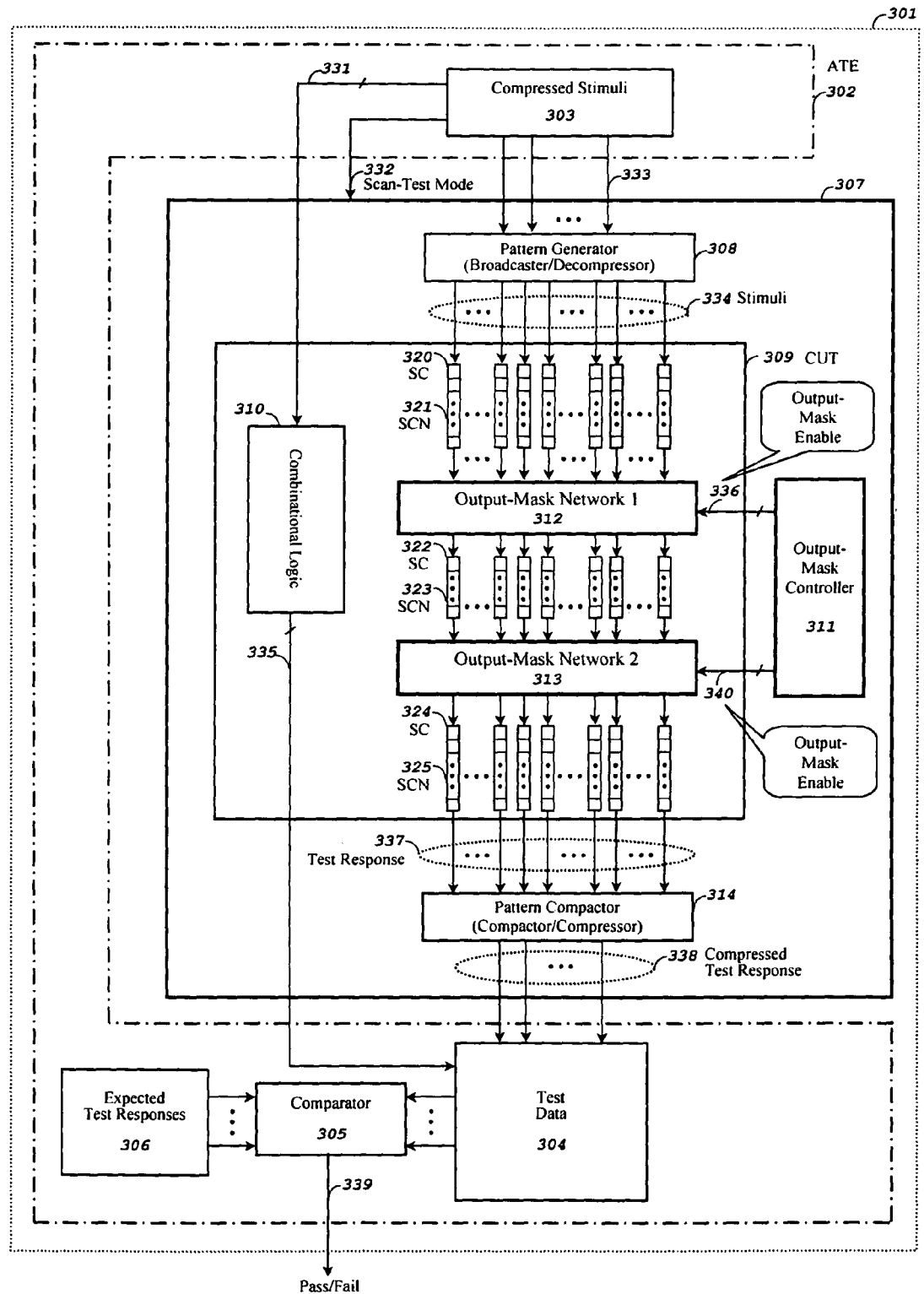
FIG. 3A shows a block diagram of a compressed scan test environment in scan-test mode, where two output-mask networks are embedded among three groups of scan cells to mask off unknown ('x') values in the test responses captured in the first and the second groups of scan cells from coming into a pattern compactor, in accordance with the present invention.

FIG. 3A shows a block diagram 301 of a compressed scan test environment in scan-test mode, in accordance with the present invention.

The circuit-under-test (CUT) 309 consists of a combinational logic block 310 and a plurality of scan chains SCN 321, SCN 323, and SCN 325. Test stimuli 334 are provided to the scan chains from a pattern generator 308, which is either a broadcaster or a decompressor. The pattern generator is used to decompress compressed stimuli 303 provided from the ATE (automatic test equipment) 302. Note that some compressed stimuli 303 may be provided directly to the combinational logic block 310 through 331.

All scan cells are divided into three groups. The first group of scan cells SC 320 form scan chains SCN 321 which are close to the pattern generator 308. The second group of scan cells SC 322 form scan chains SCN 323 existing between the output-mask network 1 312 and the output-mask network 2 313. The third group of scan cells SC 324 form scan chains SCN 325 which are close to the pattern compactor 314. Both output-mask networks are controlled by an output-mask controller 311 through output-mask enable signals Output-Mask Enable 336 and 340. Note that the scan cell grouping is conducted in such a way that only scan cells in the first and the second groups of scan cells may capture unknown ('x') values in test responses. The two output-mask networks are controlled in such a way that unknown ('x') values in the test responses captured in the first and the second groups of scan cells are masked off from coming into the pattern compactor 314. The results from the pattern compactor become compressed test responses 338, which are then compared with expected test responses 306 to find the pass/fail status of the CUT 309. Note that the pattern compactor can be a sequential compressor, an x-tolerant sequential compressor, a linear compactor, or an x-tolerant linear compactor. Here, a sequential compressor includes a multi-input signature register (MISR), an x-tolerant sequential compressor includes an x-tolerant MISR, and a linear compactor or an x-tolerant linear compactor includes one or more Exclusive-OR (XOR) gates or Exclusive-NOR (XNOR) gates.

Figure 3B:
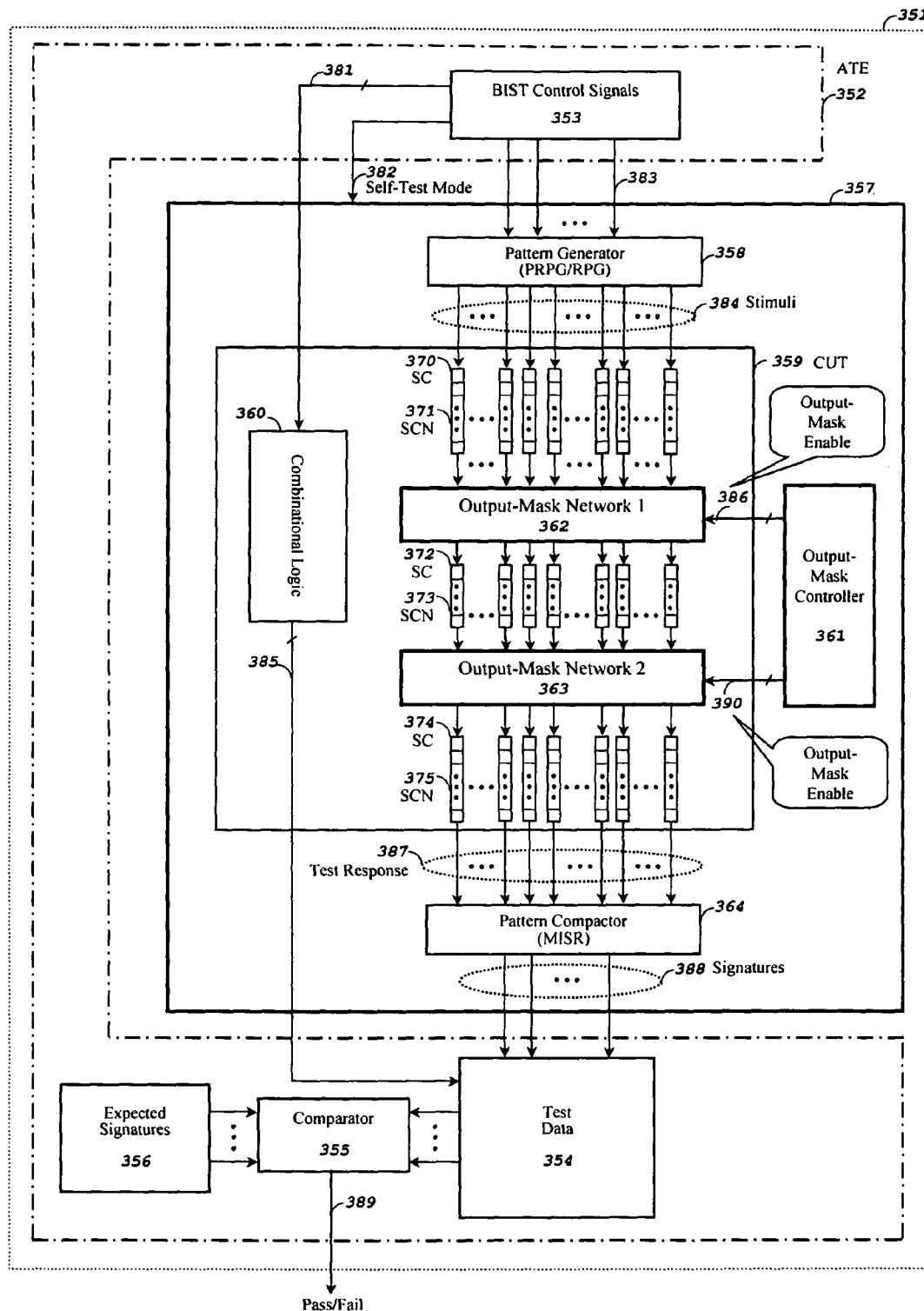
FIG. 3B shows a block diagram of a compressed scan test environment in self-test mode, where two output-mask networks are embedded among three groups of scan cells to mask off unknown ('x') values in the test responses captured in the first and the second groups of scan cells from coming into a pattern compactor, in accordance with the present invention.

FIG. 3B shows a block diagram 351 of a compressed scan test environment in self-test mode, in accordance with the present invention.

The circuit-under-test (CUT) 359 consists of a combinational logic block 360 and a plurality of scan chains SCN 371, SCN 373, and SCN 375. Test stimuli 384 are provided to the scan chains from a pattern generator 358, which is either a pseudorandom pattern generator (PRPG) or a random pattern generator (RPG). The pattern generator is used to automatically generate test stimuli 384, controlled by some BIST (built-in self-test) control signals 383 provided from the ATE (automatic test equipment) 352. Note that some BIST control signals 353 may be provided directly to the combinational logic block 360 through 381.

All scan cells are divided into three groups. The first group of scan cells SC 370 form scan chains SCN 371 which are close to the pattern generator 358. The second group of scan cells SC 372 form scan chains SCN 373 existing between the output-mask network 1 362 and the output-mask network 2 363. The third group of scan cells SC 374 form scan chains SCN 375 which are close to the pattern compactor 364. Both output-mask networks are controlled by an output-mask controller 361 through output-mask enable signals Output-Mask Enable 386 and 390. Note that the scan cell grouping is conducted in such a way that only scan cells in the first and the second groups of scan cells may capture unknown ('x') values in test responses. The two output-mask networks are controlled in such a way that unknown ('x') values in the test responses captured in the first and the second groups of scan cells are masked off from coming into the pattern compactor 364. The final status of the pattern compactor becomes a signature 388, which is then compared with the expected signature 356 to find the pass/fail status of the CUT 359. Note that the pattern compactor can be a sequential compressor, an x-tolerant sequential compressor, a linear compactor, or an x-tolerant linear compactor. Here, a sequential compressor includes a multi-input signature register (MISR), an x-tolerant sequential compressor includes an x-tolerant MISR, and a linear compactor or an x-tolerant linear compactor includes one or more Exclusive-OR (XOR) gates or Exclusive-NOR (XNOR) gates.

Figure 4:
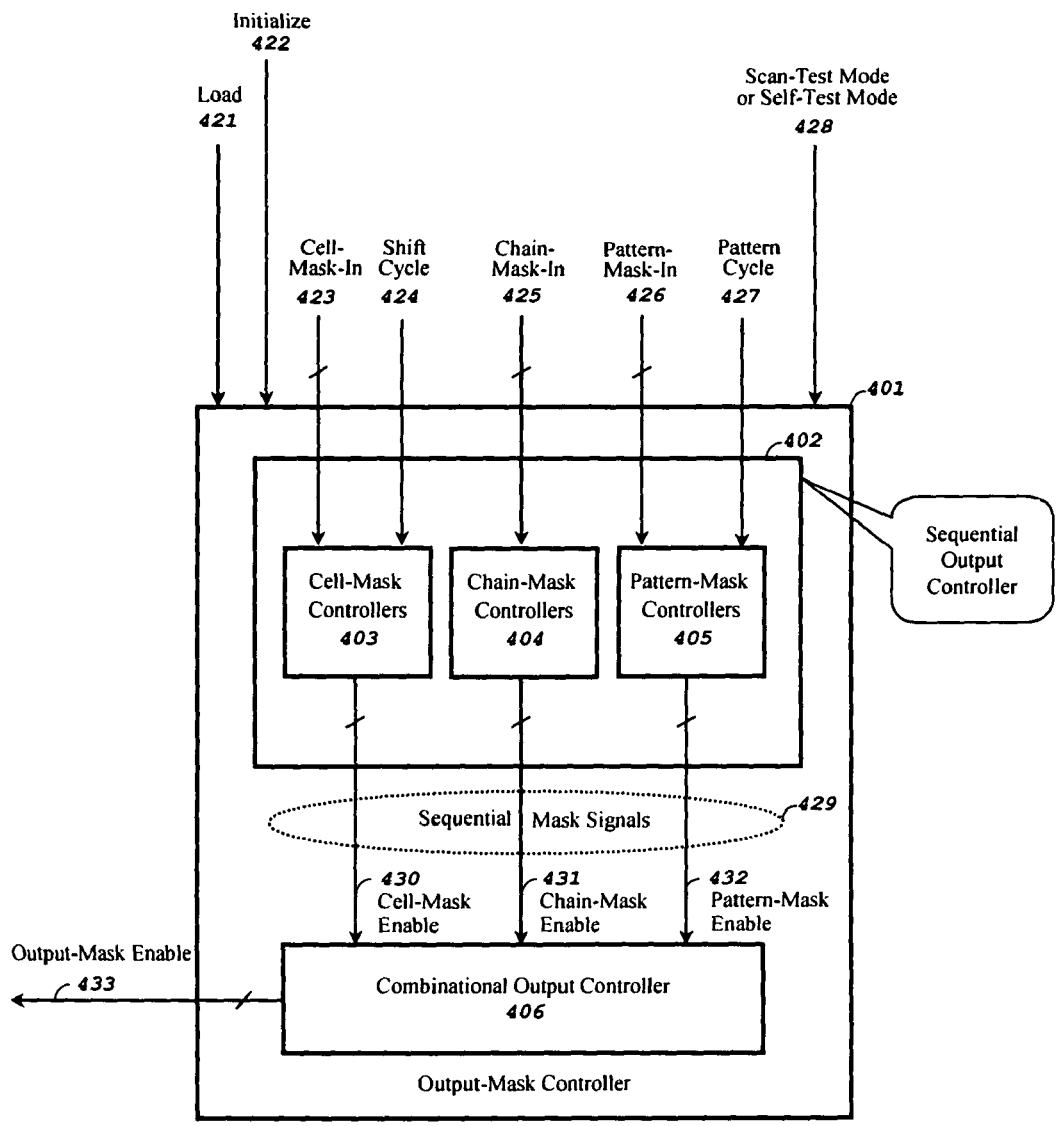
FIG. 4 shows a block diagram of an output-mask controller, in accordance with the present invention.

FIG. 4 shows a block diagram of an output-mask controller 401, in accordance with the present invention.

The output-mask controller 401 comprises a combinational output controller 406 and a sequential output controller 402. The sequential output controller further comprises any combination of cell-mask controllers 403, chain-mask controllers 404, and pattern-mask controllers 405. The output-mask controller can further include an Initialize signal 422, which is used to either initialize the sequential output controller or to bypass the combinational output controller.

The cell-mask controllers 403 store the pass/mask information for scan cell locations across all scan chains. This information is programmed through the Cell-Mask-In inputs 423 when the Load signal 421 is asserted. In addition, the Shift Cycle input 424 can be used to specify the scan cell location available at the scan outputs for compaction. Based on the preprogrammed cell-mask information, the cell-mask controllers 403 generate cell mask enable signals Cell-Mask Enable 430.

The chain-mask controllers 404 store the pass/mask information for all scan chains. This information is programmed through the Chain-Mask-In inputs 425 when the Load signal 421 is asserted. Based on the preprogrammed chain-mask information, the chain-mask controllers 404 generate chain mask enable signals Chain-Mask Enable 431.

The pattern-mask controllers 405 store the pass/mask information for all scan patterns. This information is programmed through the Pattern-Mask-In inputs 426 when the Load signal 421 is asserted. In addition, the Pattern Cycle input 427 can be used to specify the scan pattern currently being compacted. Based on the preprogrammed pattern-mask information, the pattern-mask controllers 405 generate pattern mask enable signals Pattern-Mask Enable 432.

The signals of Cell-Mask Enable 430, Chain-Mask Enable 431, and Pattern-Mask Enable 432 are collectively referred to as Sequential-Mask Signals 429, which are used to control the combinational output controller 406.

The combinational output controller 406 is used to generate a plurality of output-mask enable signals Output-Mask Enable 433. These enable signals are used to control one or more output-mask networks to perform desired masking on output data streams coming from scan chains.

Figure 5A:
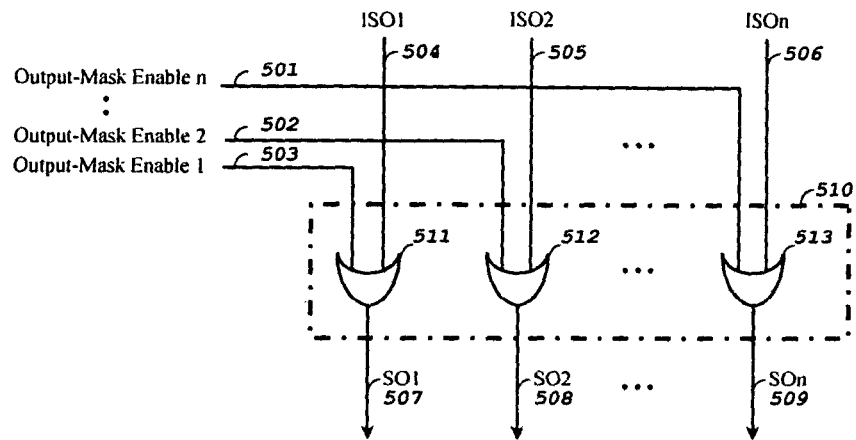
FIG. 5A shows a first embodiment of an output-mask network, which is composed of OR gates, in accordance with the present invention.

FIG. 5A shows a first embodiment of an output-mask network 510, in accordance with the present invention. The output-mask network 510 consists of one or more OR gates 511 to 513, one for each internal scan chain output. Output-mask enable signals Output-Mask Enable 1 503 to Output-Mask Enable n 501 are ORed with internal scan chain outputs ISO1 504 to ISOn 506, respectively. The outputs of the OR gates become external scan outputs SO1 507 to SOn 509. In this embodiment, an internal scan chain output is masked off if its corresponding output-mask enable signal is set to logic value 1.

Figure 5B:
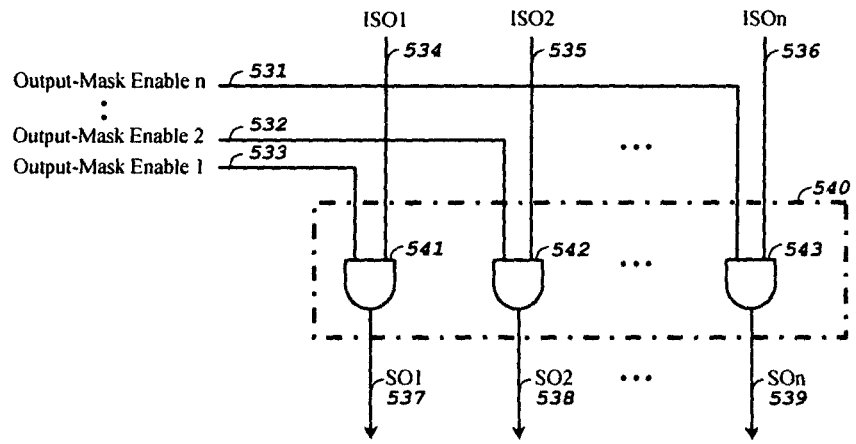
FIG. 5B shows a second embodiment of an output-mask network, which is composed of AND gates, in accordance with the present invention.

FIG. 5B shows a second embodiment of an output-mask network 540, in accordance with the present invention. The output-mask network 540 consists of one or more AND gates 541 to 543, one for each internal scan chain output. Output-mask enable signals Output-Mask Enable 1 533 to Output-Mask Enable n 531 are ANDed with internal scan chain outputs ISO1 534 to ISOn 536, respectively. The outputs of the AND gates become external scan outputs SO1 537 to SOn 539. In this embodiment, an internal scan chain output is masked off if its corresponding output-mask enable signal is set to logic value 0.

Figure 5C:
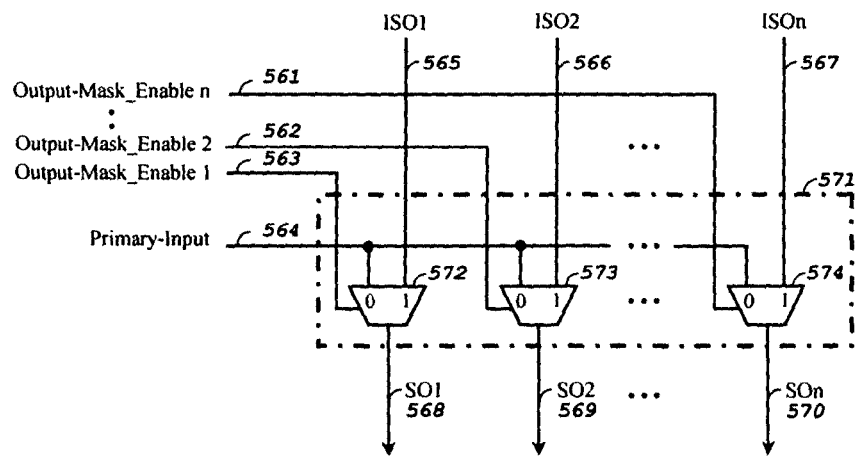
FIG. 5C shows a third embodiment of an output-mask network, which is composed of multiplexors, in accordance with the present invention.

FIG. 5C shows a third embodiment of an output-mask network 571, in accordance with the present invention. The output-mask network 571 consists of one or more multiplexors 572 to 574, one corresponding to each internal scan chain output. Output-mask enable signals Output-Mask Enable 1 563 to Output-Mask Enable n 561 are used to select either scan chain outputs ISO1 565 to ISOn 567 or the Primary-Input signal 564 to drive the external scan chain outputs SO1 568 to SOn 570, respectively. In this embodiment, a scan chain output is masked off if its corresponding output-mask enable signal is set to logic value 0.

Figure 6:
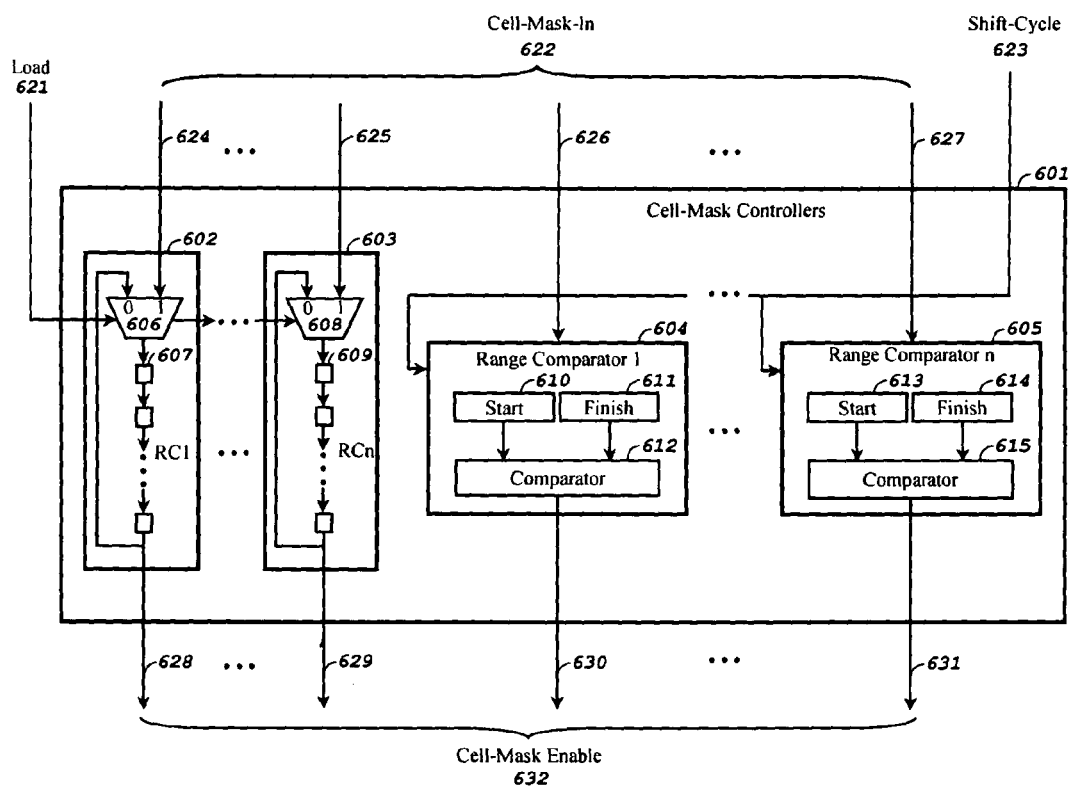
FIG. 6 shows a block diagram of cell-mask controllers, in accordance with the present invention.

FIG. 6 shows block diagrams of cell-mask controllers 601, in accordance with the present invention. The cell-mask controllers 601 consist of any number of ring counters RC1 602 to RCn 603 and range comparators Range Comparator 1 604 to Range Comparator n 605.

A ring counter, such as RC1 602, consists of a multiplexor 606 and a number of storage elements 607 connected as a shift register. The number of storage elements typically matches the number of scan cells in the longest scan chain in a scan core. The output 628 of the ring counter RC1 602 consists of the output of a storage element that is used to specify the cell-mask information for the scan cell location across all scan chains currently to be masked off. Note that the output 628 of the ring counter RC1 602 is part of Cell-Mask Enable signals 632. Depending on the value of the Load signal 621, the values of the storage elements in the ring counter RC1 602 can be either updated through the input 624 or rotated inside the ring counter. Note that the input 624 is part of the Cell-Mask-In inputs 622.

A range comparator, such as Range Comparator 1 604, consists of a start register 610, a finish register 611, and a comparator 612. The start register 610 is used to store the scan cell location across all scan chains from which scan cells should be masked off. The finish register 611 is used to store the scan cell location across all scan chains until which scan cells should be masked off. The current scan cell location being compacted is specified by the Shift-Cycle signal 623. The comparator 612 is used to determine if the current scan cell location falls between the specified start and finish locations. The comparison result is generated on the output 630, which is part of Cell-Mask Enable signals 632. Note that the start and finish registers in Range Comparator 1 604 are programmed through the input 626, which is part of Cell-Mask-In signals 622.

Figure 7:
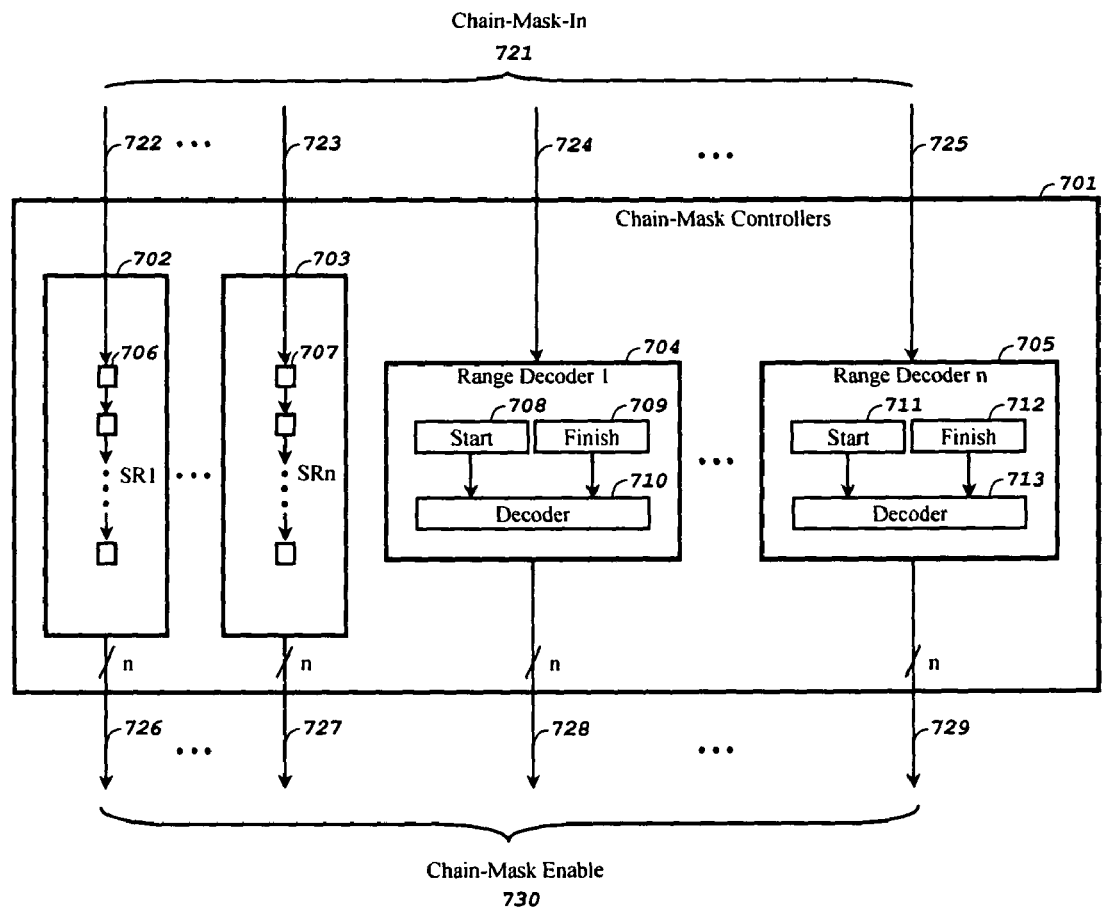
FIG. 7 shows a block diagram of chain-mask controllers, in accordance with the present invention.

FIG. 7 shows block diagrams of chain-mask controllers 701, in accordance with the present invention. The chain-mask controllers 701 consist of any number of shift registers SR1 702 to SRn 703 and range decoders Range Decoder 1 704 to Range Decoder n 705.

A shift register, such as SR1 702, consists of a number of storage elements 706. The number of storage elements typically matches the number of scan chains in a scan core. The output 726 of the shift register SR1 702 consists of the outputs of all storage elements in the shift register SR1 702. The information on the output 726 is used to specify the chain-mask information for all scan chains in parallel. Note that the output 726 is part of Chain-Mask Enable signals 730. The values of the storage elements in the shift register SR1 702 can be updated through the input 722, which is part of Chain-Mask-In inputs 721.

A range decoder, such as Range Decoder 1 704, consists of a start register 708, a finish register 709, and a decoder 710. The start register 708 is used to store the scan chain number from which scan chains should be masked off. The finish register 709 is used to store the scan chain number until which scan chains should be masked off. The contents of the start register and the finish register are then decoded to generate the chain-mask information for all scan chains in parallel on the output 728, which is part of Chain-Mask Enable signals 730. Note that the start register 708 and the finish register 709 are programmed through the input 724, which is part of Chain-Mask-In signals 721.

Figure 8:
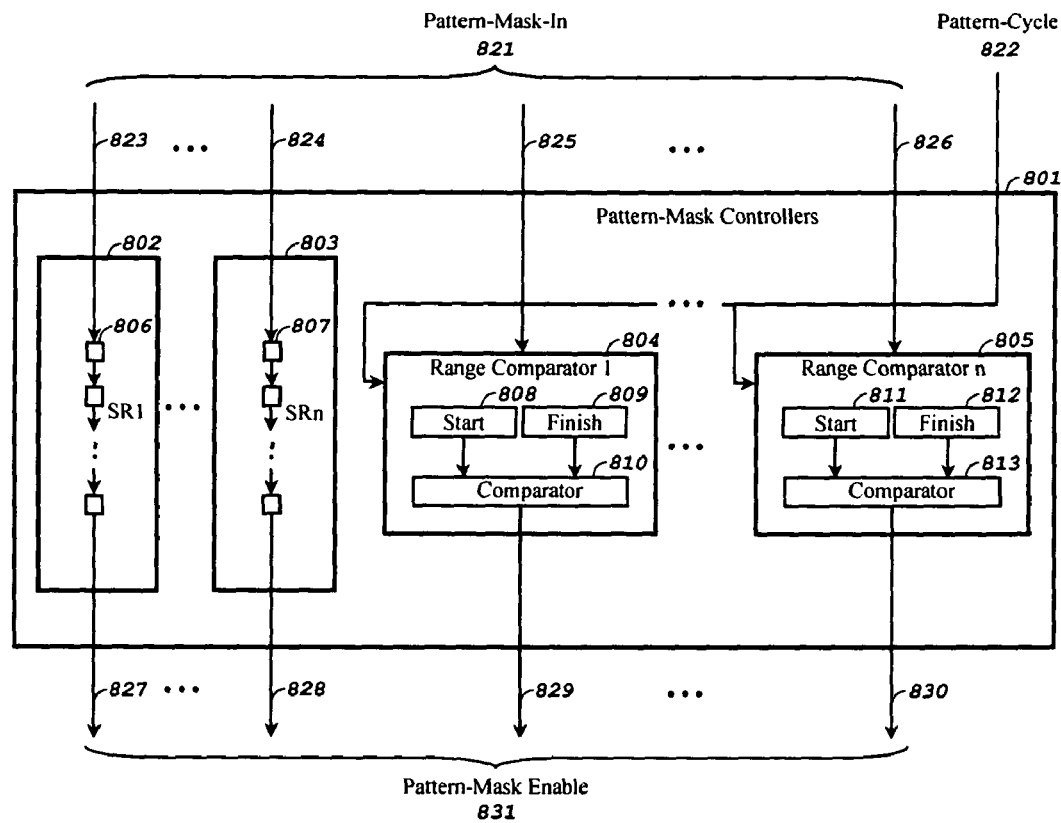
FIG. 8 shows a block diagram of pattern-mask controllers, in accordance with the present invention.

FIG. 8 shows block diagrams of pattern-mask controllers 801, in accordance with the present invention. The pattern-mask controllers 801 consist of any number of shift registers SR1 802 to SRn 803 and range comparators Range Comparator 1 804 to Range Comparator n 805.

A shift register, such as SR1 802, consists of a number of storage elements 806. The number of storage elements typically matches the number of scan patterns applied to a scan core. The output 827 of the shift register SR1 802 consists of the output of a storage element that is used to specify the pattern-mask information for the scan pattern currently being applied. Note that the output 827 is part of Pattern-Mask Enable signals 831. The values of the storage elements in the shift register SR1 802 can be updated through the input 823, which is part of Pattern-Mask-In inputs 821.

A range comparator, such as Range Comparator 1 804, consists of a start register 808, a finish register 809, and a comparator 810. The start register 808 is used to store the scan pattern number from which scan patterns should be masked off. The finish register 809 is used to store the scan pattern number until which scan patterns should be masked off. The current scan pattern being applied is specified by the Pattern-Cycle signal 822. The comparator 810 is used to determine if the current scan pattern falls between the programmed scan pattern ranges. The comparison result is generated on the output 829, which is part of Pattern-Mask Enable signals 831. Note that the start register 808 and the finish register 809 are programmed through the input 825, which is part of Pattern-Mask-In signals 821.

Figure 9:
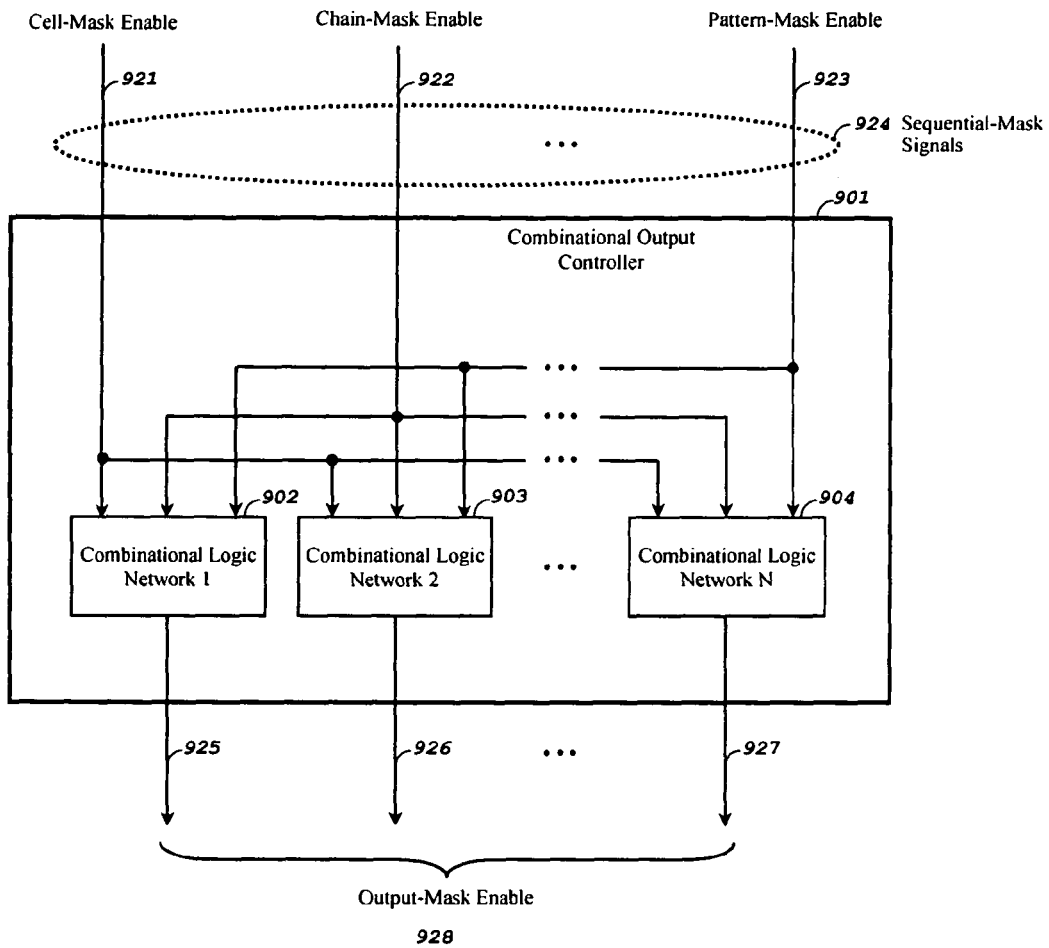
FIG. 9 shows a block diagram of a combinational output controller, in accordance with the present invention.

FIG. 9 shows a block diagram of a combinational output controller 901, in accordance with the present invention. The combinational output controller 901 consists of a number of combinational logic networks Combinational Logic Network 1 902 to Combinational Logic Network n 904, each corresponding to one scan chain output. Each combinational logic network accepts Sequential-Mask signals 924 as inputs and generates one output-mask enable signal as part of Output-Mask Enable signals 928, which are used to control an output-mask network.

Figure 10A:
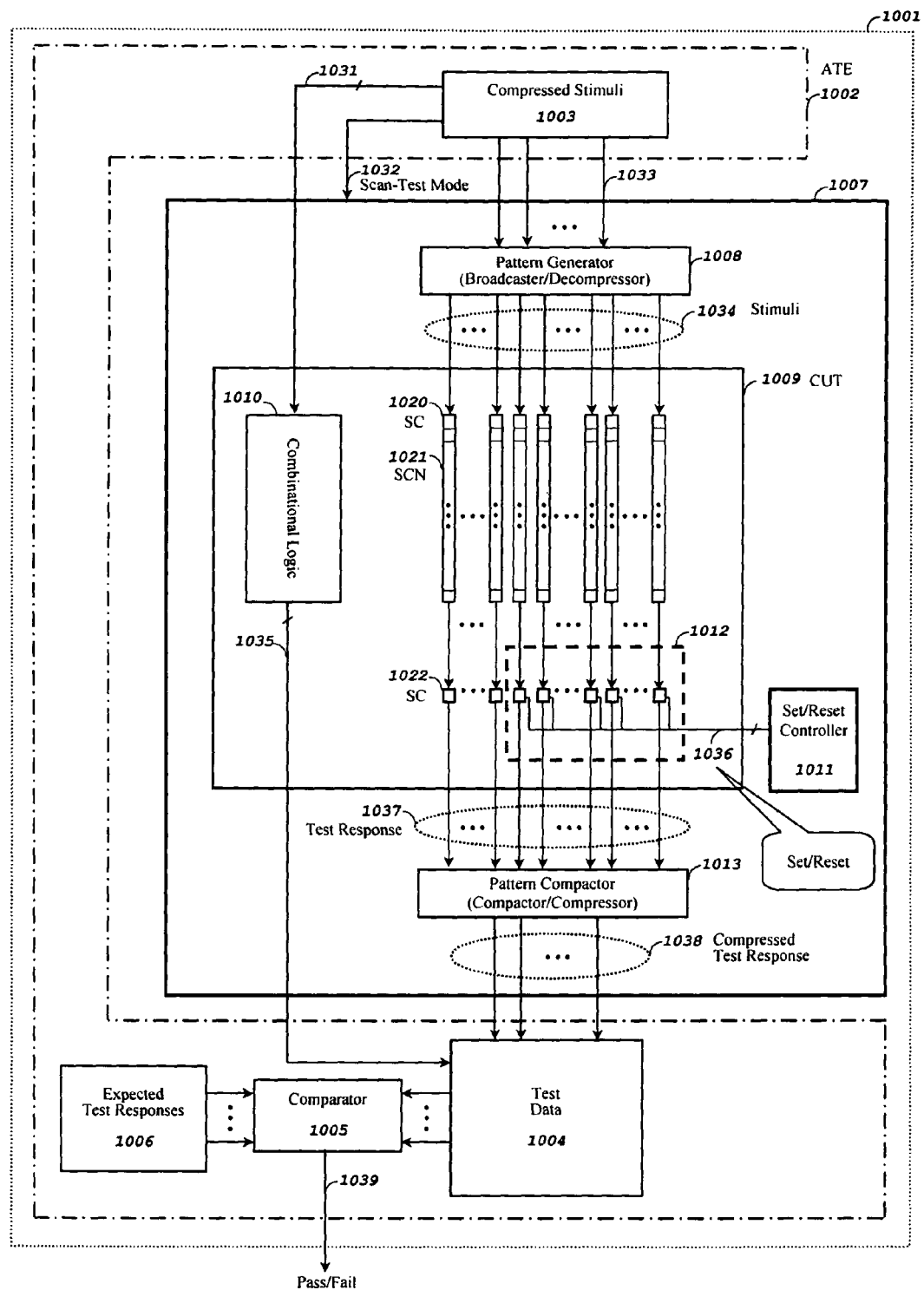
FIG. 10A shows a block diagram of a compressed scan test environment in scan-test mode, where the set/reset inputs of the last scan cells in some scan chains are controlled by a set/reset controller to mask off unknown ('x') values in test responses in corresponding scan chains, in accordance with the present invention.

FIG. 10A shows a block diagram 1001 of a compressed scan test environment in scan-test mode, in accordance with the present invention.

The circuit-under-test (CUT) 1009 consists of a combinational logic block 1010 and a plurality of scan chains SCN 1021. Test stimuli 1034 are provided to the scan chains from a pattern generator 1008, which is either a broadcaster or a decompressor. The pattern generator is used to decompress compressed stimuli 1003 provided from the ATE (automatic test equipment) 1002. Note that some compressed stimuli 1003 may be provided directly to the combinational logic block 1010 through 1031.

The set/reset inputs of the last scan cells 1012 in some scan chains are controlled by a set/reset controller 1011. Note that the scan cell ordering is conducted in such a way that only scan cells in the scan chains with the scan cells in 1012 as last scan cells may capture unknown ('x') values in test responses. Also note that the set/reset controller can be connected to existing scan cells with set/reset inputs, to existing scan cells by adding set/reset inputs, or to new scan cells that include set/reset inputs. The set/reset inputs of the scan cells in 1012 are controlled in such a way that unknown ('x') values in test responses are masked off from coming into a pattern compactor 1013. The results from the pattern compactor become compressed test responses 1038, which are then compared with expected test responses 1006 to find the pass/fail status of the CUT 1009. Note that the pattern compactor can be a sequential compressor, an x-tolerant sequential compressor, a linear compactor, or an x-tolerant linear compactor. Here, a sequential compressor includes a multi-input signature register (MISR), an x-tolerant sequential compressor includes an x-tolerant MISR, and a linear compactor or an x-tolerant linear compactor includes one or more Exclusive-OR (XOR) gates or Exclusive-NOR (XNOR) gates.

Figure 10B:
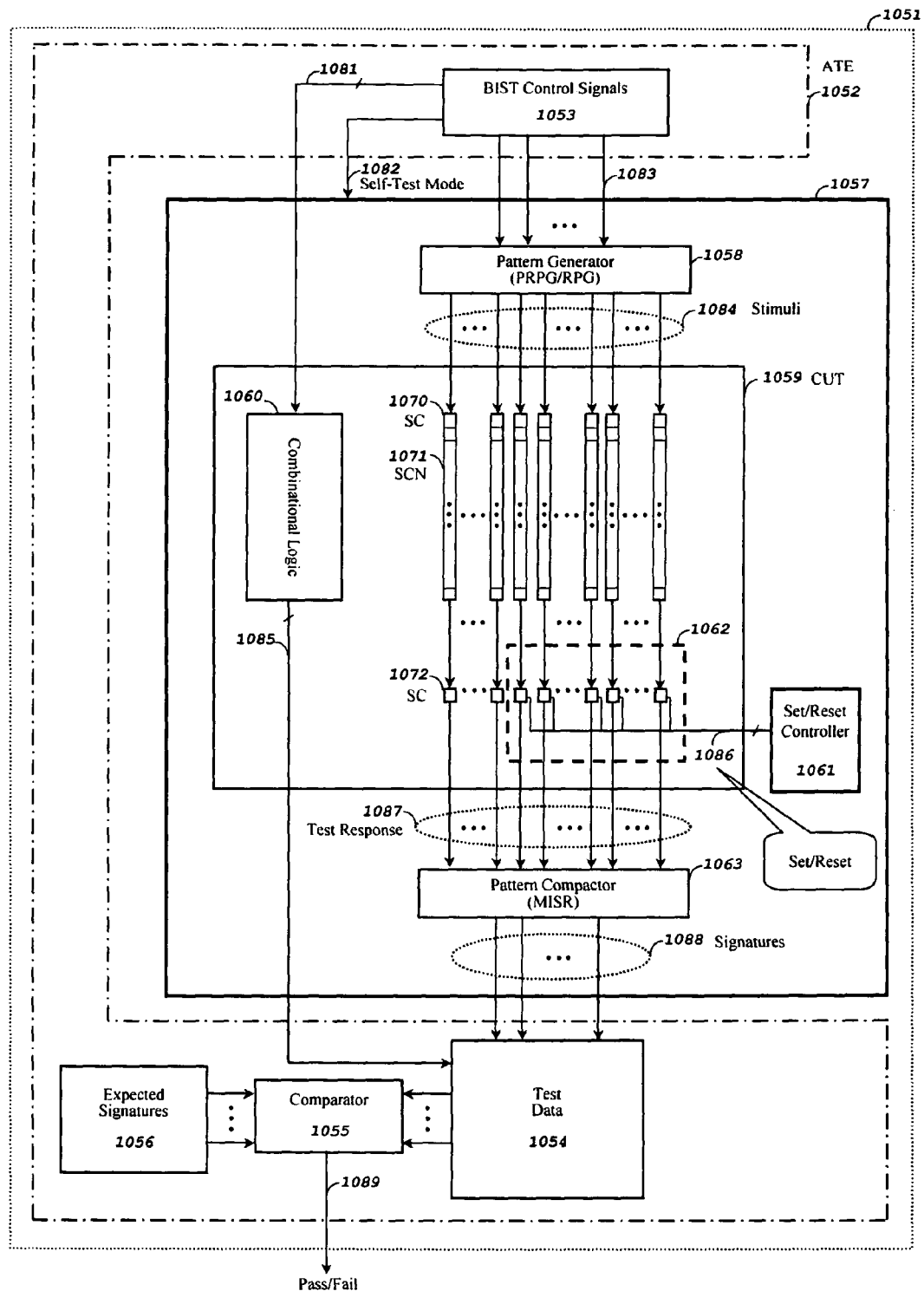
FIG. 10B shows a block diagram of a compressed scan test environment in self-test mode, where the set/reset inputs of the last scan cells in some scan chains are controlled by a set/reset controller to mask off unknown ('x') values in test responses in corresponding scan chains, in accordance with the present invention.

FIG. 10B shows a block diagram 1051 of a compressed scan test environment in self-test mode, in accordance with the present invention.

The circuit-under-test (CUT) 1059 consists of a combinational logic block 1060 and a plurality of scan chains SCN 1071. Test stimuli 1084 are provided to the scan chains from a pattern generator 1058, which is either a pseudorandom pattern generator (PRPG) or a random pattern generator (RPG). The pattern generator is used to automatically generate test stimuli 1084, controlled by some BIST (built-in self-test) control signals 1083 provided from the ATE (automatic test equipment) 1052. Note that some BIST control signals 1053 may be provided directly to the combinational logic block 1060 through 1081.

The set/reset inputs of the last scan cells 1062 in some scan chains are controlled by a set/reset controller 1061. Note that the scan cell ordering is conducted in such a way that only scan cells in the scan chains with the scan cells in 1062 as last scan cells may capture unknown ('x') values in test responses. Also note that the set/reset controller can be connected to existing scan cells with set/reset inputs, to existing scan cells by adding set/reset inputs, or to new scan cells that include set/reset inputs. The set/reset inputs of the scan cells in 1062 are controlled in such a way that unknown ('x') values in test responses are masked off from coming into a pattern compactor 1063. The final status of the pattern compactor becomes a signature 1088, which is then compared with the expected signature 1056 to find the pass/fail status of the CUT 1059. Note that the pattern compactor can be a sequential compressor, an x-tolerant sequential compressor, a linear compactor, or an x-tolerant linear compactor. Here, a sequential compressor includes a multi-input signature register (MISR), an x-tolerant sequential compressor includes an x-tolerant MISR, and a linear compactor or an x-tolerant linear compactor includes one or more Exclusive-OR (XOR) gates or Exclusive-NOR (XNOR) gates.

Figure 11A:
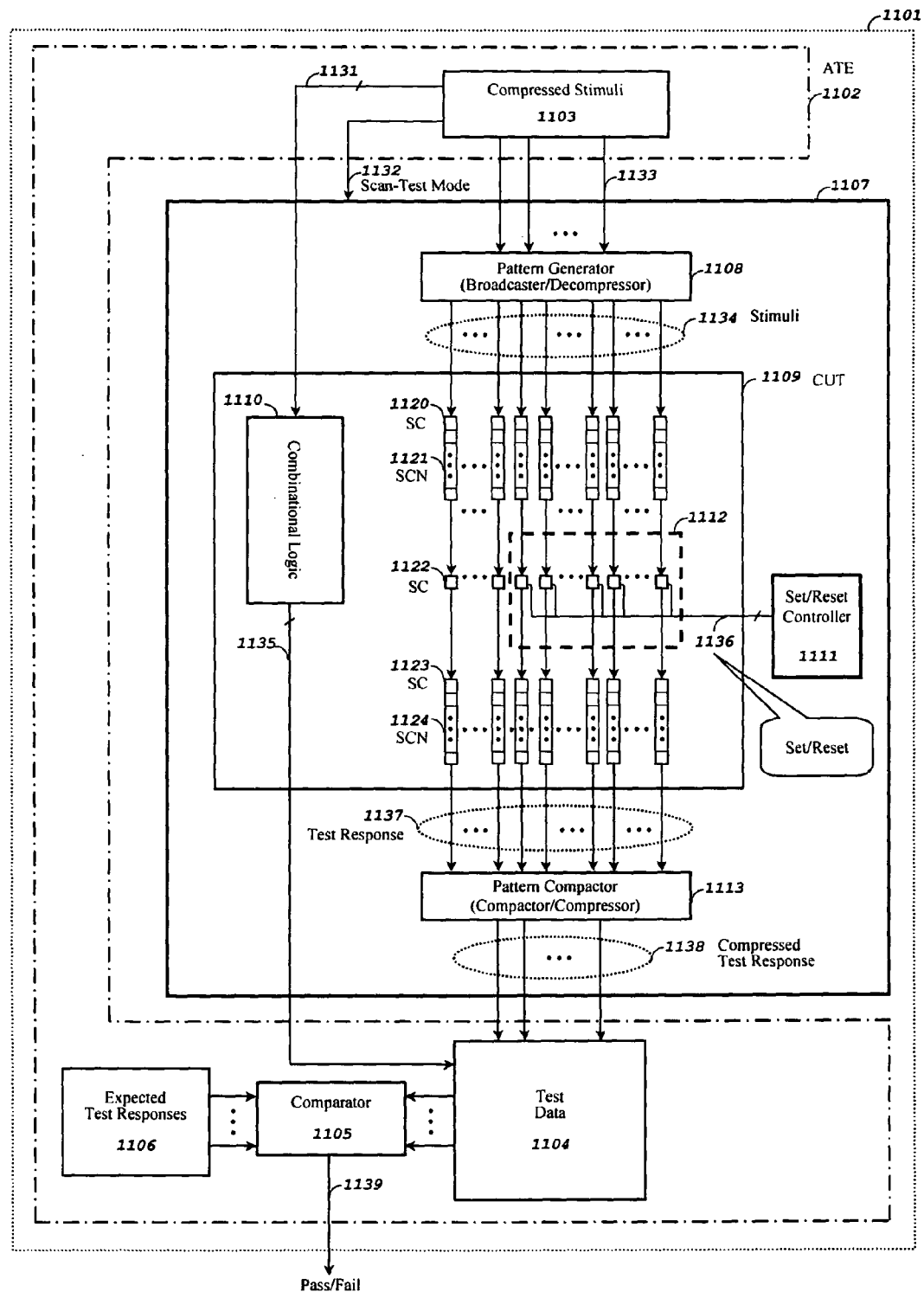
FIG. 11A shows a block diagram of a compressed scan test environment in scan-test mode, where the set/reset inputs of some internal scan cells in some scan chains, one such scan cell for one such scan chain, are controlled by a set/reset controller to mask off unknown ('x') values in test responses, in accordance with the present invention.

FIG. 11A shows a block diagram 1101 of a compressed scan test environment in scan-test mode, in accordance with the present invention. 0087 The circuit-under-test (CUT) 1109 consists of a combinational logic block 1110 and a plurality of scan chains. Test stimuli 1134 are provided to the scan chains from a pattern generator 1108, which is either a broadcaster or a decompressor. The pattern generator is used to decompress compressed stimuli 1103 provided from the ATE (automatic test equipment) 1102. Note that some compressed stimuli 1103 may be provided directly to the combinational logic block 1110 through 1131.

The set/reset inputs of some internal scan cells 1112 in some scan chains, one such scan cell for one such scan chain, are controlled by a set/reset controller 1111. Note that the scan cell ordering is conducted in such a way that only scan cells before the scan cells in 1112 in scan chains may capture unknown ('x') values in test responses. Also note that the set/reset controller can be connected to existing scan cells with set/reset inputs, to existing scan cells by adding set/reset inputs, or to new scan cells that include set/reset inputs. The set/reset inputs of the scan cells in 1112 are controlled in such a way that unknown ('x') values in test responses are masked off from coming into a pattern compactor 1113. The results from the pattern compactor become compressed test responses 1138, which are then compared with expected test responses 1106 to find the pass/fail status of the CUT 1109. Note that the pattern compactor can be a sequential compressor, an x-tolerant sequential compressor, a linear compactor, or an x-tolerant linear compactor. Here, a sequential compressor includes a multi-input signature register (MISR), an x-tolerant sequential compressor includes an x-tolerant MISR, and a linear compactor or an x-tolerant linear compactor includes one or more Exclusive-OR (XOR) gates or Exclusive-NOR (XNOR) gates.

Figure 11B:
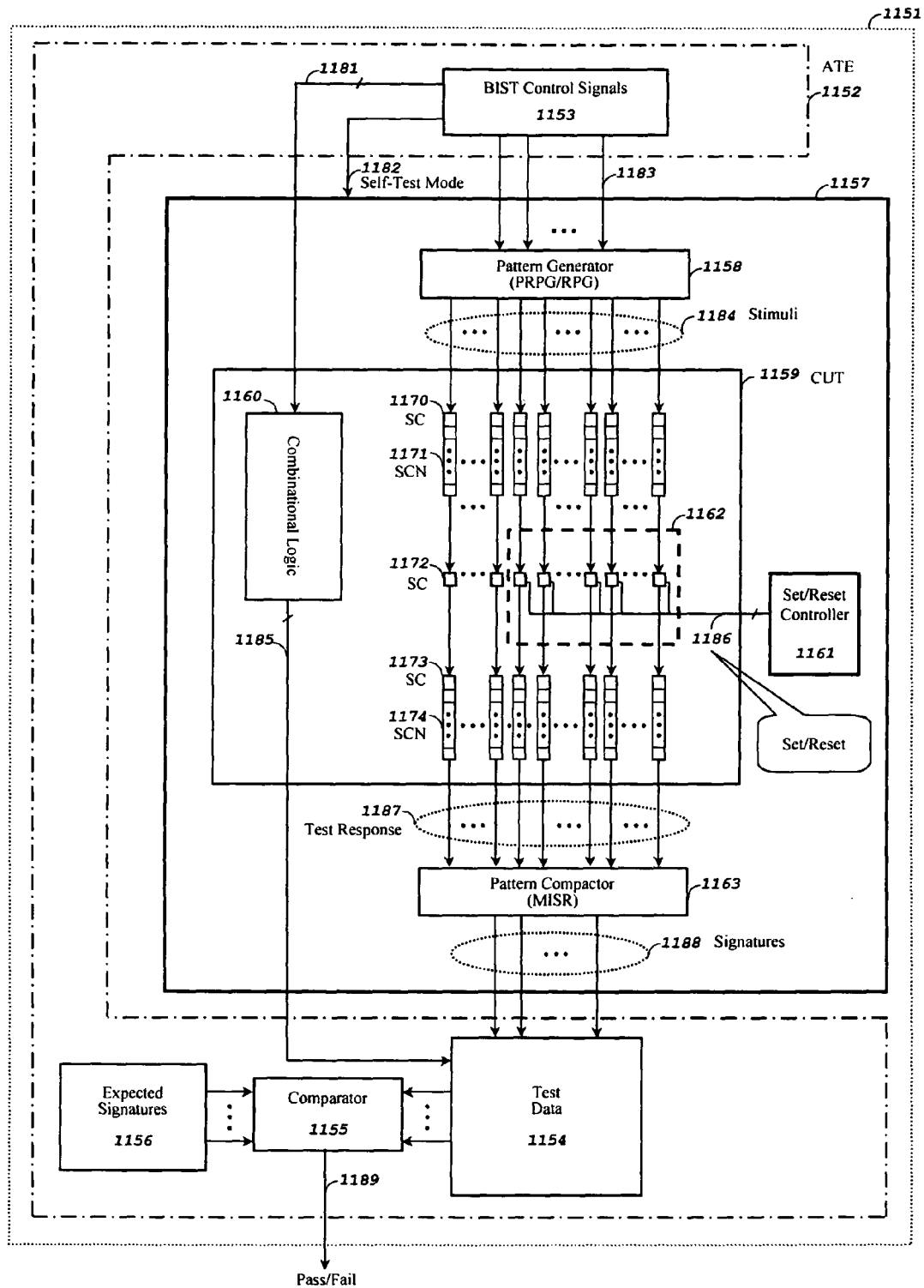
FIG. 11B shows a block diagram of a compressed scan test environment in self-test mode, where the set/reset inputs of some internal scan cells in some scan chains, one such scan cell for one such scan chain, are controlled by a set/reset controller to mask off unknown ('x') values in test responses, in accordance with the present invention.

FIG. 11B shows a block diagram 1151 of a compressed scan test environment in self-test mode, in accordance with the present invention.

The circuit-under-test (CUT) 1159 consists of a combinational logic block 1160 and a plurality of scan chains. Test stimuli 1184 are provided to the scan chains from a pattern generator 1158, which is either a pseudorandom pattern generator (PRPG) or a random pattern generator (RPG). The pattern generator is used to automatically generate test stimuli 1184, controlled by some BIST (built-in self-test) control signals 1183 provided from the ATE (automatic test equipment) 1152. Note that some BIST control signals 1153 may be provided directly to the combinational logic block 1160 through 1181.

The set/reset inputs of some internal scan cells 1162 in some scan chains, one such scan cell for one such scan chain, are controlled by a set/reset controller 1161. Note that the scan cell ordering is conducted in such a way that only scan cells before the scan cells in 1162 in scan chains may capture unknown ('x') values in test responses. Also note that the set/reset controller can be connected to existing scan cells with set/reset inputs, to existing scan cells by adding set/reset inputs, or to new scan cells that include set/reset inputs. The set/reset inputs of the scan cells in 1162 are controlled in such a way that unknown ('x') values in test responses are masked off from coming into a pattern compactor 1163. The final status of the pattern compactor becomes a signature 1188, which is then compared with the expected signature 1156 to find the pass/fail status of the CUT 1159. Note that the pattern compactor can be a sequential compressor, an x-tolerant sequential compressor, a linear compactor, or an x-tolerant linear compactor. Here, a sequential compressor includes a multi-input signature register (MISR), an x-tolerant sequential compressor includes an x-tolerant MISR, and a linear compactor or an x-tolerant linear compactor includes one or more Exclusive-OR (XOR) gates or Exclusive-NOR (XNOR) gates.

Figure 12:
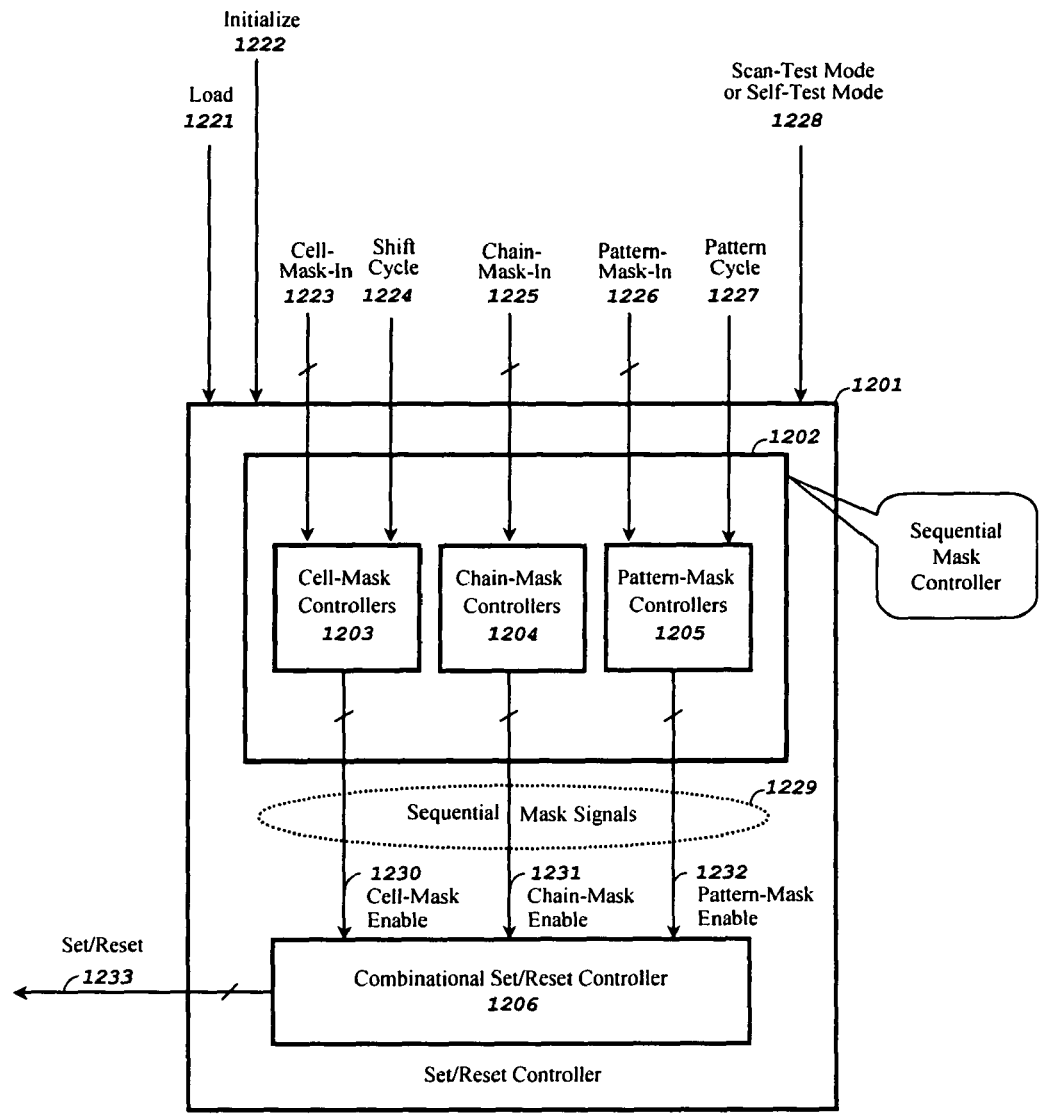
FIG. 12 shows a block diagram of a set/reset controller, in accordance with the present invention.

FIG. 12 shows a block diagram of a set/reset controller 1201, in accordance with the present invention.

The set/reset controller 1201 comprises a combinational set/reset controller 1206 and a sequential mask controller 1202. The sequential mask controller further comprises any combination of cell-mask controllers 1203, chain-mask controllers 1204, and pattern-mask controllers 1205. The set/reset controller can further include an Initialize signal 1222, which is used to either initialize the sequential mask controller or to bypass the combinational set/reset controller.

The cell-mask controllers 1203 store the pass/mask information for scan cell locations across all scan chains. This information is programmed through the Cell-Mask-In inputs 1223 when the Load signal 1221 is asserted. In addition, the Shift Cycle input 1224 can be used to specify the scan cell location available for the purpose of masking off unknown values. Based on the preprogrammed cell-mask information, the cell-mask controllers 1203 generate cell mask enable signals Cell-Mask Enable 1230.

The chain-mask controllers 1204 store the pass/mask information for all scan chains. This information is programmed through the Chain-Mask-In inputs 1225 when the Load signal 1221 is asserted. Based on the preprogrammed chain-mask information, the chain-mask controllers 1204 generate chain mask enable signals Chain-Mask Enable 1231.

The pattern-mask controllers 1205 store the pass/mask information for all scan patterns. This information is programmed through the Pattern-Mask-In inputs 1226 when the Load signal 1221 is asserted. In addition, the Pattern Cycle input 1227 can be used to specify the scan pattern currently being masking-off. Based on the preprogrammed pattern-mask information, the pattern-mask controllers 1205 generate pattern mask enable signals Pattern-Mask Enable 1232.

The signals of Cell-Mask Enable 1230, Chain-Mask Enable 1231 and Pattern-Mask Enable 1232 are collectively referred to as Sequential-Mask Signals 1229, which are used to control the combinational set/reset controller 1206.

The combinational set/reset controller 1206 is used to generate a plurality of set/reset signals Set/Reset 1233. These signals are used to control a selected set of scan cells to perform desired masking on output data streams coming from scan chains.

Figure 13:
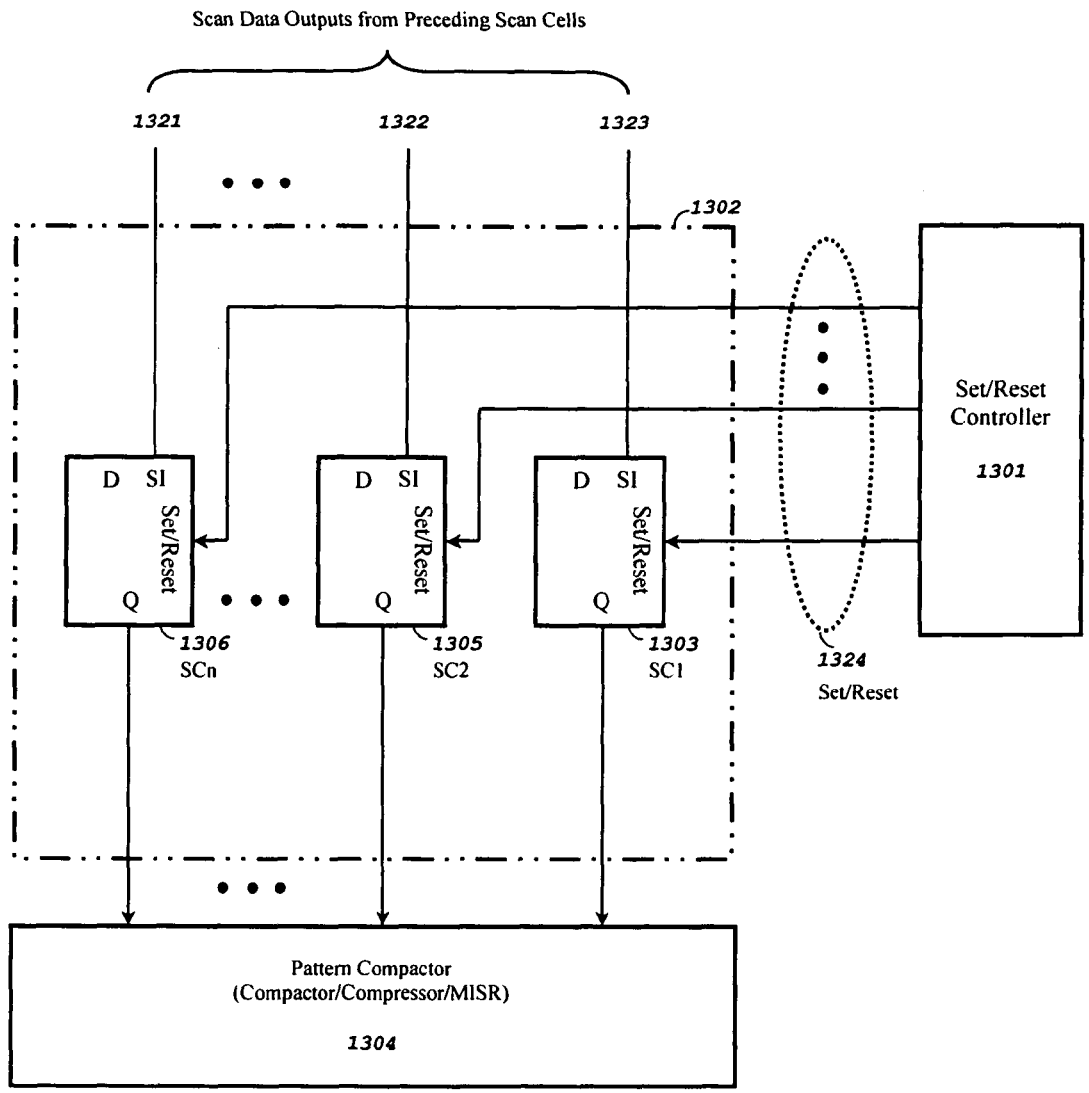
FIG. 13 shows an example of using the set/reset signals generated by a set/reset controller to control the set/reset inputs of a set of scan cells, in accordance with the present invention.

FIG. 13 shows an example of using set/reset signals Set/Reset 1324 generated by a set/reset controller 1301 to control the set/reset inputs of a set of scan cells SC1 1303, SC2 1305, to SCn 1306, in accordance with the present invention. Obviously, by properly controlling the set/reset input of a scan cell, unknown ('x') value appearing at its scan input port can be masked off from reaching the output of the scan cell.

Figure 14:
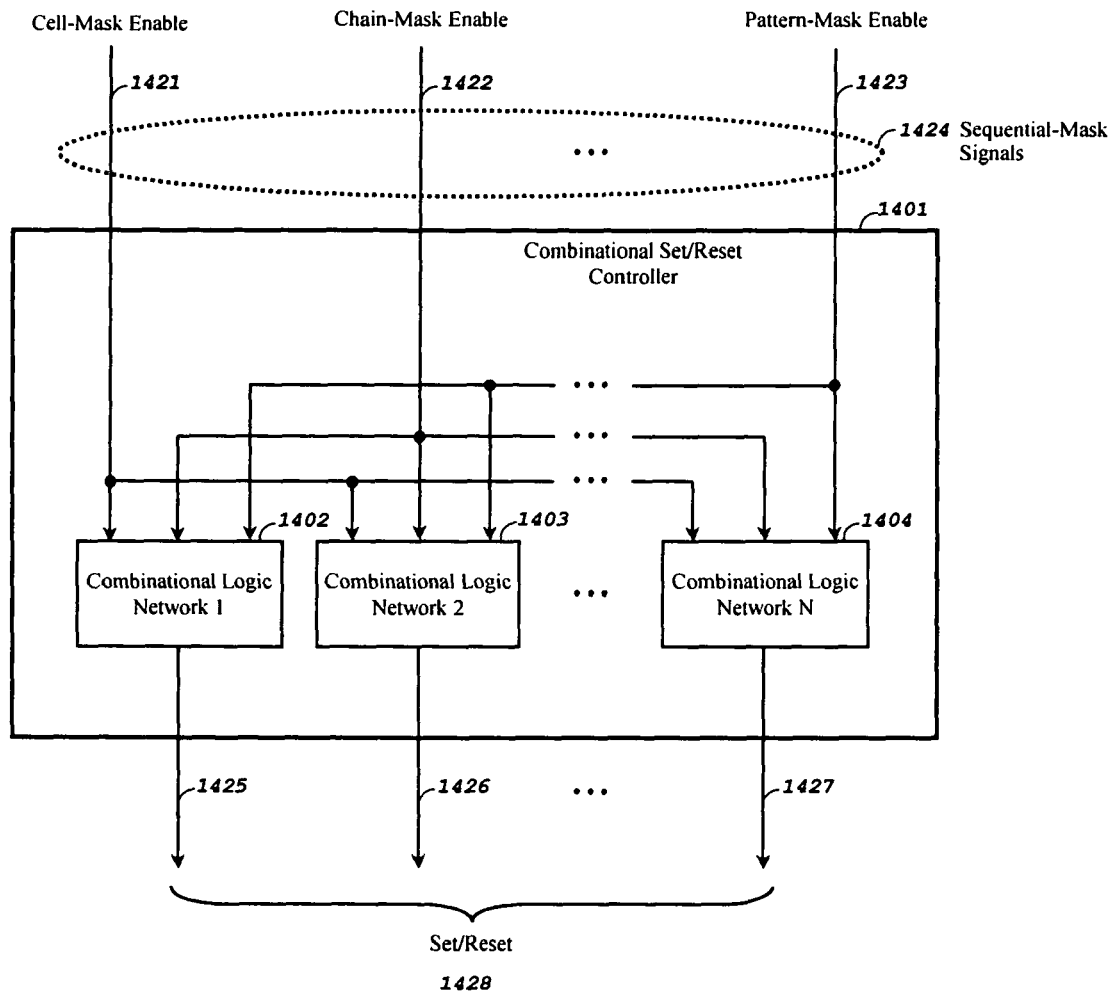
FIG. 14 shows a block diagram of a combinational set/reset controller, in accordance with the present invention.

FIG. 14 shows a block diagram of a combinational set/reset controller 1401, in accordance with the present invention. The combinational set/reset controller consists of a plurality of combinational logic networks Combinational Logic Network 1 1402 to Combinational Logic Network n 1404, each corresponding to the set/reset input of one scan cell. Each combinational logic network accepts Sequential-Mask signals 1424 as inputs and generates one set/reset signal as part of Set/Reset signals 1428. The Set/Reset signals 1428 are used to control the set/reset inputs of a selected set of scan cells.

Figure 15:
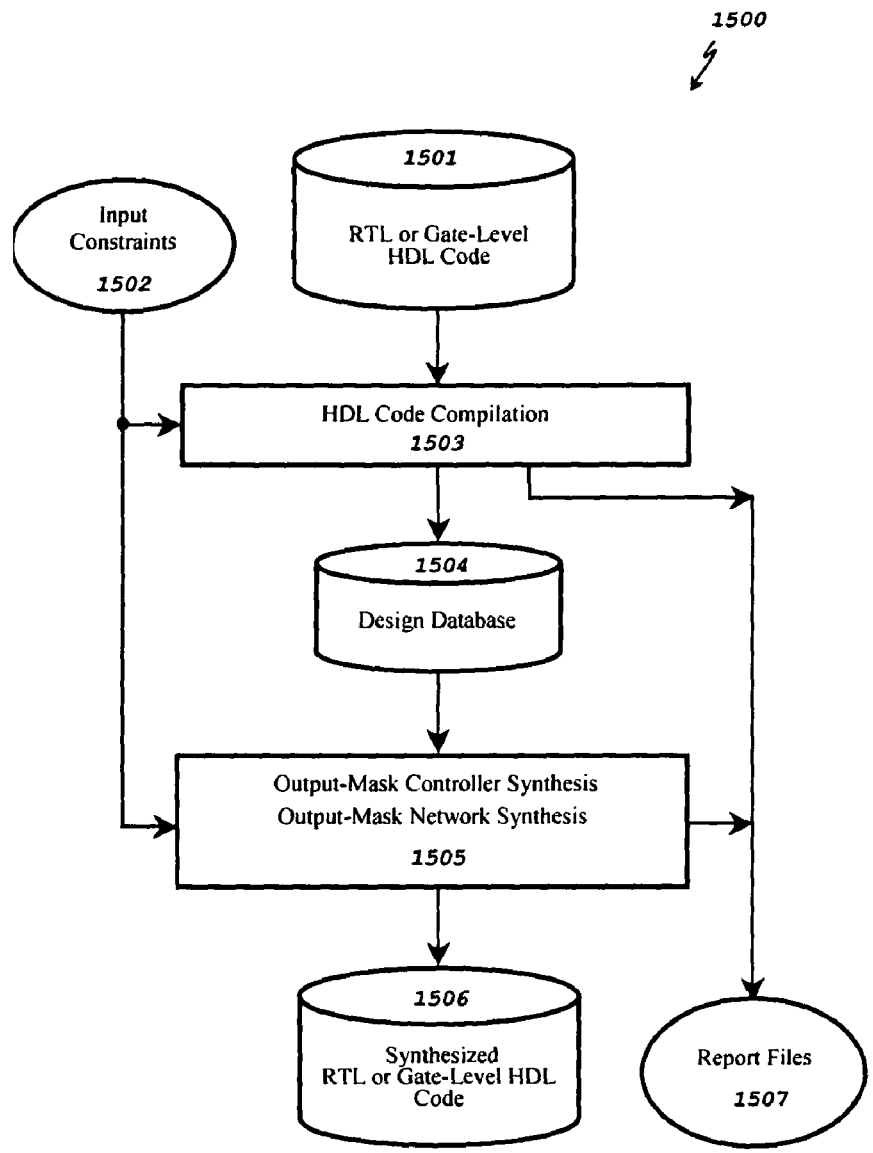
FIG. 15 shows a block diagram of a computer-aided design (CAD) system for synthesizing an output-mask controller and an output-mask network for masking off unknown ('x') in test responses in scan chains within a scan-based integrated circuit, in accordance with the present invention.

FIG. 15 shows a block diagram of a computer-aided design (CAD) system for synthesizing an output-mask controller and an output-mask network for masking off unknown ('x') in test responses in scan chains within a scan-based integrated circuit, in accordance with the present invention. The CAD system 1500 accepts the user-supplied RTL (register-transfer level) or gate-level HDL (hardware description language) code 1501, together with input constraints 1502. The input constraints 1502 contain all setup information and scripts required for compiling 1503 the HDL code 1501 into an internal design database 1504. Next, an output-mask controller and an output-mask network are synthesized 1505 in accordance with the present invention. The process produces a synthesized RTL or gate-level HDL code 1506. All reports and errors are stored in the report files 1507.

FIG. 16 shows a block diagram of a computer-aided design (CAD) system for synthesizing a set/reset controller for masking off unknown ('x') in test responses in scan chains within a scan-based integrated circuit, in accordance with the present invention. The CAD system 1600 accepts the user-supplied RTL (register-transfer level) or gate-level HDL (hardware description language) code 1601, together with input constraints 1602. The input constraints 1602 contain all setup information and scripts required for compiling 1603 the HDL code 1601 into an internal design database 1604. Next, a set/reset controller is synthesized 1605, in accordance with the present invention. The process produces a synthesized RTL or gate-level HDL code 1606. All reports and errors are stored in the report files 1607.

FIG. 17 shows an electronic design automation system, where a computer-readable program, in accordance with the present invention, performs a method for synthesizing an output-mask controller or a set/reset controller, for selectively masking off unknown ('x') values in captured test responses in either scan-test or self-test mode. The system includes a processor 1702, which operates together with a memory 1701 to run a set of software for synthesizing an output-mask controller or a set/reset controller, for selectively masking off unknown ('x') values in captured test responses in either scan-test or self-test mode. The processor 1702 may represent a central processing unit of a personal computer, workstation, mainframe computer or other suitable digital processing device. The memory 1701 can be an electronic memory or a magnetic or optical disk-based memory, or various combinations thereof. A designer interacts with the software run by the processor 1702 to provide appropriate inputs via an input device 1703, which may be a keyboard, disk drive or other suitable source of design information. The processor 1702 provides outputs to the designer via an output device 1704, which may be a display, a printer, a disk drive or various combinations of these and other elements.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A method for synthesizing an output-mask controller for generating a plurality of output-mask enable signals for selectively masking off unknown ('x') captured scan data in first selected scan cells from propagating through scan chains for test, debug, diagnosis, and yield improvement of a scan-based integrated circuit in a selected scan-test mode or a selected self-test mode, the scan-based integrated circuit containing a plurality of scan chains, a plurality of pattern generators, a plurality of pattern compactors, and an output-mask network embedded on a scan data input path of second selected scan cells, each scan chain comprising multiple scan cells coupled in series; said method comprising computer-implemented steps of:
    (a) a computer compiling HDL (hardware description language) code modeled at RTL (register-transfer level) or at gate-level that represents said scan-based integrated circuit into a design database;
    (b) specifying input constraints on said output-mask controller;
    (c) synthesizing said output-mask controller and said output-mask network on said design database according to said input constraints; and
    (d) generating synthesized HDL code for said output-mask controller and said output-mask network in a selected RTL or gate-level format.

2. The method of claim 1, wherein said specifying input constraints on said output-mask controller further comprises automatically generating said input constraints based on said design database.

3. The method of claim 1, wherein said synthesizing said output-mask controller on said design database according to said input constraints further comprises synthesizing a sequential output controller for generating a plurality of sequential-mask signals, and a combinational output controller accepting said plurality of sequential-mask signals for generating said plurality of output-mask enable signals for controlling said output-mask network for selectively masking off unknown ('x') captured scan data in said first selected scan cells from propagating through said scan chains.

4. The method of claim 3, wherein said synthesizing a sequential output controller further comprises synthesizing a load signal to load said sequential output controller with a predetermined state for selectively masking off said unknown ('x') captured scan data in said first selected scan cells from propagating through said scan chains.

5. The method of claim 3, wherein said synthesizing a sequential output controller further comprises synthesizing an initialize signal to control said combinational output controller to allow all said unknown ('x') captured scan data in said first selected scan cells to propagate through said scan chains.

6. The method of claim 3, wherein said synthesizing a sequential output controller further comprises synthesizing a plurality of selected cell-mask controllers for generating one or more selected cell-mask enable signals, a plurality of selected chain-mask controllers for generating one or more selected chain-mask enable signals, and a plurality of selected pattern-mask controllers for generating one or more selected pattern-mask enable signals; wherein said selected cell-mask enable signals, said selected chain-mask enable signals, and said selected pattern-mask enable signals are grouped as said plurality of sequential-mask signals.

7. The method of claim 6, wherein each of said selected cell-mask controllers in said sequential output controller is a first finite-state machine generating one or more said selected cell-mask enable signals.

8. The method of claim 7, wherein said first finite-state machine is selectively a ring counter (RC) or a first range comparator.

9. The method of claim 6, wherein each of said selected chain-mask controllers in said sequential output controller is a second finite-state machine generating one or more said selected chain-mask enable signals.

10. The method of claim 9, wherein said second finite-state machine is selectively a first shift register (SR) or a range decoder.

11. The method of claim 6, wherein each of said selected pattern-mask controllers in said sequential output controller is a third finite-state machine generating one or more said selected pattern-mask enable signals.

12. The method of claim 11, wherein said third finite state machine is selectively a second shift register (SR) or a second range comparator.

13. The method of claim 3, wherein said synthesizing a combinational output controller further comprises synthesizing one or more selected combinational logic networks for accepting said plurality of sequential-mask signals as inputs for generating said plurality of output-mask enable signals for controlling said output-mask network for selectively masking off said unknown ('x') captured scan data in said first selected scan cells from propagating through said scan chains.

14. The method of claim 13, wherein each of said selected combinational logic networks further comprises one or more first selected combinational gates; wherein each of said first selected combinational gates is selectively an AND gate, OR gate, NAND gate, NOR gate, Exclusive-OR (XOR) gate, Exclusive-NOR (XNOR) gate, multiplexor (MUX), or inverter (INV).

15. The method of claim 1, wherein said output-mask network further comprises one or more second selected combinational gates; wherein each of said second selected combinational gates is selectively an AND gate, OR gate, NAND gate, NOR gate, or multiplexor (MUX).

16. The method of claim 1, wherein said synthesizing said output-mask network further comprises not embedding said output-mask network on said scan data input path of said second selected scan cells of selected scan chains wherein no said unknown ('x') captured scan data is present.

17. The method of claim 1, wherein said synthesizing said output-mask network further comprises embedding said output-mask network on said scan data input path of said second selected scan cells of selected scan chains wherein no said unknown ('x) captured scan data is present after said second selected scan cells, wherein said second selected scan cells are not at the end of said selected scan chains.

18. A computer-readable memory having computer-readable program code embodied therein for causing a computer system to perform a method for synthesizing an output-mask controller for generating a plurality of output-mask enable signals for selectively masking off unknown ('x') captured scan data in first selected scan cells from propagating through scan chains for test, debug, diagnosis, and yield improvement of a scan-based integrated circuit in a selected scan-test mode or a selected self-test mode, the scan-based integrated circuit containing a plurality of scan chains, a plurality of pattern generators, a plurality of pattern compactors, and an output-mask network embedded on the scan data input path of second selected scan cells, each scan chain comprising multiple scan cells coupled in series; said method comprising computer-implemented steps of:

(a) compiling HDL (hardware description language) code modeled at RTL (register-transfer level) or at gate-level that represents said scan-based integrated circuit into a design database;

(b) specifying input constraints on said output-mask controller;

(c) synthesizing said output-mask controller and said output-mask network on said design database according to said input constraints; and (d) generating synthesized HDL code for said output-mask controller and said output-mask network in a selected RTL or gate-level format.

19. An electronic design automation system comprising: a processor; a bus coupled to said processor; and a computer-readable memory coupled to said bus and having computer-readable program code embodied therein for causing said electronic design automation system to perform a method for synthesizing an output-mask controller for generating a plurality of output-mask enable signals for selectively masking off unknown ('x') captured scan data in first selected scan cells from propagating through scan chains for test, debug, diagnosis, and yield improvement of a scan-based integrated circuit in a selected scan-test mode or a selected self-test mode, the scan-based integrated circuit containing a plurality of scan chains, a plurality of pattern generators, a plurality of pattern compactors, and an output-mask network embedded on a scan data input path of second selected scan cells, each scan chain comprising multiple scan cells coupled in series; said method comprising computer-implemented steps of:

(a) compiling HDL (hardware description language) code modeled at RTL (register-transfer level) or at gate-level that represents said scan-based integrated circuit into a design database;

(b) specifying input constraints on said output-mask controller;

(c) synthesizing said output-mask controller and said output-mask network on said design database according to said input constraints; and (d) generating synthesized HDL code for said output-mask controller and said output-mask network in a selected RTL or gate-level format.

20. A method for synthesizing a set/reset controller for generating a plurality of set/reset signals for selectively masking off unknown ('x') captured scan data in first selected scan cells from propagating through scan chains for test, debug, diagnosis, and yield improvement of a scan-based integrated circuit in a selected scan-test mode or a selected self-test mode, the scan-based integrated circuit containing a plurality of scan chains, a plurality of pattern generators, and a plurality of pattern compactors, each scan chain comprising multiple scan cells coupled in series, said plurality of set/reset signals controlling selected set/reset inputs of second selected scan cells; said method comprising computer-implemented steps of:

(a) a computer compiling HDL (hardware description language) code modeled at RTL (register-transfer level) or at gate-level that represents said scan-based integrated circuit into a design database;

(b) specifying input constraints on said set/reset controller;

(c) synthesizing said set/reset controller on said design database according to said input constraints; and (d) generating synthesized HDL code for said set/reset controller in a selected RTL or gate-level format.

21. The method of claim 20, wherein said specifying input constraints on said set/reset controller further comprises automatically generating said input constraints based on said design database.

22. The method of claim 20, wherein said synthesizing said set/reset controller on said design database according to said input constraints further comprises synthesizing a sequential mask controller for generating a plurality of sequential-mask signals, and a combinational set/reset controller accepting said plurality of sequential-mask signals for generating said plurality of set/reset signals for controlling said selected set/reset inputs of said second selected scan cells for selectively masking off unknown ('x') captured scan data in said first selected scan cells from propagating through said scan chains.

23. The method of claim 22, wherein said synthesizing a sequential mask controller further comprises synthesizing a load signal to load said sequential mask controller with a predetermined state for selectively masking off said unknown ('x') captured scan data in said first selected scan cells from propagating through said scan chains.

24. The method of claim 22, wherein said synthesizing a sequential mask controller further comprises synthesizing an initialize signal to control said combinational set/reset controller to allow all said unknown ('x') captured scan data in said first selected scan cells to propagate through said scan chains.

25. The method of claim 22, wherein said synthesizing a sequential mask controller further comprises synthesizing a plurality of selected cell-mask controllers for generating one or more selected cell-mask enable signals, a plurality of selected chain-mask controllers for generating one or more selected chain-mask enable signals, and a plurality of selected pattern-mask controllers for generating one or more selected pattern-mask enable signals; wherein said selected cell-mask enable signals, said selected chain-mask enable signals, and said selected pattern-mask enable signals are grouped as said plurality of sequential-mask signals.

26. The method of claim 25, wherein each of said selected cell-mask controllers in said sequential mask controller is a first finite-state machine generating one or more said selected cell-mask enable signals.

27. The method of claim 26, wherein said first finite-state machine is selectively a ring counter (RC) or a first range comparator.

28. The method of claim 25, wherein each of said selected chain-mask controllers in said sequential mask controller is a second finite-state machine generating one or more said selected chain-mask enable signals.

29. The method of claim 28, wherein said second finite-state machine is selectively a first shift register (SR) or a range decoder.

30. The method of claim 25, wherein each of said selected pattern-mask controllers in said sequential mask controller is a third finite-state machine generating one or more said selected pattern-mask enable signals.

31. The method of claim 30, wherein said third finite-state machine is selectively a second shift register (SR) or a second range comparator.

32. The method of claim 22, wherein said synthesizing a combinational set/reset controller further comprises synthesizing one or more selected combinational logic networks for accepting said plurality of sequential-mask signals as inputs for generating said plurality of set/reset signals for controlling said selected set/reset inputs for selectively masking off said unknown ('x') captured scan data in said first selected scan cells from propagating through said scan chains.

33. The method of claim 32, wherein each of said selected combinational logic networks further comprises one or more first selected combinational gates; wherein each said first selected combinational gate is selectively an AND gate, OR gate, NAND gate, NOR gate, Exclusive-OR (XOR) gate, Exclusive-NOR (XNOR) gate, multiplexor (MUX), or inverter (INV).

34. The method of claim 20, wherein said plurality of set/reset signals selectively control a selected set or a selected reset input of said second selected scan cells.

35. The method of claim 20, wherein synthesizing said set/reset controller further comprises not controlling said selected set/reset inputs of said second selected scan cells of selected scan chains wherein no said unknown ('x') captured scan data is present.

36. The method of claim 20, wherein said synthesizing said set/reset controller further comprise synthesizing said plurality of set/reset signals for controlling said selected set/reset inputs of said second selected scan cells of selected scan chains wherein no said unknown ('x') captured scan data is present after said second selected scan cells, wherein said second selected scan cells are not at the end of said selected scan chains.

37. A computer-readable memory having computer-readable program code embodied therein for causing a computer system to perform a method for synthesizing a set/reset controller for generating a plurality of set/reset signals for selectively masking off unknown ('x') captured scan data in first selected scan cells from propagating through scan chains for test, debug, diagnosis, and yield improvement of a scan-based integrated circuit in a selected scan-test mode or a selected self-test mode, the scan-based integrated circuit containing a plurality of scan chains, a plurality of pattern generators, and a plurality of pattern compactors, each scan chain comprising multiple scan cells coupled in series, said plurality of set/reset signals controlling selected set/reset inputs of second selected scan cells; said method comprising computer-implemented steps of:

(a) compiling HDL (hardware description language) code modeled at RTL (register-transfer level) or at gate-level that represents said scan-based integrated circuit into a design database;
(b) specifying input constraints on said set/reset controller;
(c) synthesizing said set/reset controller on said design database according to said input constraints; and
(d) generating synthesized HDL code for said set/reset controller in a selected RTL or gate-level format.

38. An electronic design automation system comprising: a processor; a bus coupled to said processor; and a computer-readable memory coupled to said bus and having computer-readable program code embodied therein for causing said electronic design automation system to perform a method for synthesizing a set/reset controller for generating a plurality of set/reset signals for selectively masking off unknown ('x') captured scan data in first selected scan cells from propagating through scan chains for test, debug, diagnosis, and yield improvement of a scan-based integrated circuit in a selected scan-test mode or a selected self-test mode, the scan-based integrated circuit containing a plurality of scan chains, a plurality of pattern generators, and a plurality of pattern compactors, each scan chain comprising multiple scan cells coupled in series, said plurality of set/reset signals controlling selected set/reset inputs of second selected scan cells; said method comprising computer-implemented steps of:

(a) compiling HDL (hardware description language) code modeled at RTL (register-transfer level) or at gate-level that represents said scan-based integrated circuit into a design database;
(b) specifying input constraints on said set/reset controller;
(c) synthesizing said set/reset controller on said design database according to said input constraints; and
(d) generating synthesized HDL code for said set/reset controller in a selected RTL or gate-level format.

\* \* \* \* \*